(12) United States Patent
Clark et al.

(10) Patent No.: US 11,449,152 B2
(45) Date of Patent: Sep. 20, 2022

(54) ELECTRONIC DRUMS

(71) Applicant: Sonuus Limited, St Neots (GB)

(72) Inventors: James Hastings Clark, St Neots (GB); John Michael McAuliffe, St Neots (GB)

(73) Assignee: SONUUS LIMITED, St Neots (GB)

( * ) Notice: Subject to any disclaimer, the term of this patent is extended or adjusted under 35 U.S.C. 154(b) by 0 days.

(21) Appl. No.: 17/266,479

(22) PCT Filed: Aug. 7, 2019

(86) PCT No.: PCT/GB2019/052221
§ 371 (c)(1),
(2) Date: Feb. 5, 2021

(87) PCT Pub. No.: WO2020/030912
PCT Pub. Date: Feb. 13, 2020

(65) Prior Publication Data
US 2021/0304718 A1    Sep. 30, 2021

(30) Foreign Application Priority Data

Aug. 7, 2018   (GB) .................................... 1812826
Jun. 26, 2019  (GB) .................................... 1909213

(51) Int. Cl.
*G06F 3/02*   (2006.01)
*G06F 3/023*  (2006.01)
(Continued)

(52) U.S. Cl.
CPC ............ *G06F 3/0205* (2013.01); *G06F 3/023* (2013.01); *G10D 13/02* (2013.01); *G10D 13/20* (2020.02);
(Continued)

(58) Field of Classification Search
CPC ....... G06F 3/0205; G06F 3/023; G10D 13/20; G10D 13/26; G10D 13/02; G10H 1/32;
(Continued)

(56) References Cited

U.S. PATENT DOCUMENTS 4,425,511 A   1/1984   Brosh
4,580,478 A   4/1986   Brosh
(Continued)

FOREIGN PATENT DOCUMENTS

CN    205942706 U    2/2017
EP      3096457 A1   11/2016
(Continued)

OTHER PUBLICATIONS

Combined Search and Examination Report issued in GB Appln. No. 1721448.7 dated Jun. 20, 2018. Cited in U.S Publication 1.
(Continued)

*Primary Examiner* — Jianchun Qin
(74) *Attorney, Agent, or Firm* — Rossi, Kimms & McDowell LLP

(57) ABSTRACT

An electronic drum, comprising: a bottom member; a drum head; a drum sensor comprising: a passive resonant circuit mounted on the drum head and having a resonant frequency; and an active resonant circuit mounted on the bottom member and configured to excite the passive resonant circuit at the resonant frequency; a sensor driver to drive the active resonant circuit with an RF drive signal at the resonant frequency; and a detector to detect a level of RF signal from the driven active resonant circuit for sensing a position and/or velocity of the drum head; and a signal processor, coupled to the detector, configured to process the detected level of RF signal to sense a position and/or velocity of the drum head for determining when the drum head is hit.

23 Claims, 15 Drawing Sheets

(51) Int. Cl.
  *H03K 17/95* (2006.01)
  *G10D 13/20* (2020.01)
  *G10D 13/10* (2020.01)
  *G10D 13/02* (2020.01)
  *G10H 1/32* (2006.01)
  *G10H 3/14* (2006.01)

(52) U.S. Cl.
  CPC ............... *G10D 13/26* (2020.02); *G10H 1/32* (2013.01); *G10H 3/146* (2013.01); *H03K 17/954* (2013.01); *G10H 2220/425* (2013.01); *G10H 2220/461* (2013.01); *G10H 2230/275* (2013.01)

(58) Field of Classification Search
  CPC ............ G10H 3/146; G10H 2220/425; G10H 2220/461; G10H 2230/275; H03K 17/954
  See application file for complete search history.

(56) References Cited

U.S. PATENT DOCUMENTS

| | | | |
|---|---|---|---|
| 4,838,139 A | 6/1989 | Fiori, Jr. | |
| 4,852,443 A * | 8/1989 | Duncan | G10H 3/146 84/DIG. 12 |
| 4,980,519 A | 12/1990 | Mathews | |
| 5,129,654 A | 7/1992 | Bogner | |
| 6,150,600 A * | 11/2000 | Buchla | G10H 1/0555 84/688 |
| 7,952,519 B1 | 5/2011 | Nielsen | |
| 8,207,729 B2 | 6/2012 | Erickson | |
| 8,690,670 B2 | 4/2014 | Kay | |
| 8,922,399 B2 | 12/2014 | Bajaj | |
| 8,933,314 B2 | 1/2015 | Clark | |
| 2002/0140419 A1 * | 10/2002 | Duret | G01B 7/004 324/207.17 |
| 2004/0056781 A1 | 3/2004 | Rix | |
| 2004/0069856 A1 | 4/2004 | Held | |
| 2006/0114129 A1 | 6/2006 | Henty | |
| 2007/0181410 A1 | 8/2007 | Baier | |
| 2009/0128337 A1 | 5/2009 | Oberle | |
| 2009/0282962 A1 | 11/2009 | Jones | |
| 2011/0102259 A1 | 5/2011 | Ledvina | |
| 2011/0187204 A1 | 8/2011 | Lacey et al. | |
| 2013/0002477 A1 | 1/2013 | Dehnie | |
| 2013/0093436 A1 | 4/2013 | Thorn | |
| 2014/0274395 A1 | 9/2014 | Ellsworth | |
| 2015/0170625 A1 | 6/2015 | Clark | |
| 2017/0031050 A1 | 2/2017 | Lisi | |
| 2019/0094984 A1 | 3/2019 | Lin | |
| 2020/0320966 A1 | 10/2020 | Clark | |

FOREIGN PATENT DOCUMENTS

| | | |
|---|---|---|
| EP | 3208796 A1 | 8/2017 |
| EP | 3291223 A1 | 3/2018 |
| GB | 2320125 A | 6/1998 |
| GB | 2482651 A | 2/2012 |
| GB | 2494230 A | 3/2013 |
| GB | 2530117 A | 3/2016 |
| WO | 2004025402 A2 | 3/2004 |
| WO | 2011128698 A1 | 10/2011 |
| WO | 2019122867 A1 | 6/2019 |

OTHER PUBLICATIONS

Combined Search and Examination Report issued in GB Appln. No. 1812826.4 dated Jan. 31, 2019. Cited in U.S. Publication 1.
International Search Report issued in Intl. Appln. No PCT/GB2018/053683 dated May 22, 2019. Cited in U.S. Publication 1.
Written Opinion issued in Intl. Appln. No. PCT/GB2018/053683 dated May 22, 2019. Cited in U.S. Publication 1.
Combined Search and Examination Report issued in GB Appln. No. 1918915 8 dated May 5, 2020. Cited in U.S. Publication 1.
Office Action issued in U.S. Appl. No. 17/266,446 dated Nov. 16, 2021.
Extended European Search Report issued in European Appln. No. 22160075.2 dated Jun. 22, 2022.
Extended European Search Report issued in European Appln. No. 22160076.0 dated Jun. 13, 2022.
Notice of Allowance issued in U.S. Appl. No. 17/266,446 dated Jun. 17, 2022.
Notice of Allowance issued in U.S. Appl. No. 17/266,446 dated Mar. 9, 2022.
Search Report issued in GB Appln. No. 1909214.7 dated Dec. 23, 2019.
International Search Report issued in Intl. Appln. No. PCT/GB2019/052220 dated Nov. 5, 2019.
Written Opinion issued in Intl. Appln. No. PCT/GB2019/052220 dated Nov. 5, 2019.
International Search Report issued in Intl. Appln. No. PCT/GB2019/052221 dated Oct. 29, 2019.
Written Opinion issued in Intl. Appln. No. PCT/GB2019/052221 dated Oct. 29, 2019.
Copending U.S. Appl. No. 17/266,446, filed Feb. 5, 2021 (a copy is not included because the cited application is not yet available to the public and the Examiner has ready access to the cited application).

* cited by examiner

ELECTRONIC DRUMS

FIELD

The invention relates to electronic drums.

BACKGROUND

There is a need for improved electronic drums.

SUMMARY

In one aspect there is therefore provided an electronic drum. The electronic drum may comprise a bottom member. The electronic drum may further comprise a drum head or pad. The electronic drum may further comprise a drum sensor. The drum sensor may comprise a passive resonant circuit mounted on the drum head and having a resonant frequency, and an active resonant circuit e.g. mounted on the bottom member and configured to excite the passive resonant circuit at the resonant frequency. The electronic drum may further comprise a sensor driver to drive the active resonant circuit with an RF drive signal at the resonant frequency. The electronic drum may further comprise a detector to detect a level of RF signal from the driven active resonant circuit for sensing a position and/or velocity of the drum head. The electronic drum may further comprise a signal processor, coupled to the detector, and configured to process the detected level of RF signal to sense a position and/or velocity of the drum head for determining when the drum head is hit.

In some implementations the signal processor is configured to process the detected level of RF signal to determine a position on the drum head where the drum head is hit. The position may be determined from a single drum sensor, e.g. from a waveform or amplitude of the detected level of RF signal, or using multiple drum sensors.

Thus in implementations the detected level of RF signal defines a drum head response waveform, and the signal processor is configured to determine both a radial position of the hit on the drum head and/or a velocity of the drum head from the drum head response waveform of a single drum sensor.

The signal processor may be further configured to process the detected level of RF signal to determine one or both of how hard the drum head is hit and a time duration of contact with the drum head when the drum head is hit.

The signal processor may be configured to process the detected level of RF signal to determine a position on the drum head where the drum head is hit. This is advantageous because a user of a sound generation system (for example a drum sound generation system) may wish to assign different sounds to different areas of the drum head. Therefore, a user may assign a 'cymbal' sound to play when an edge of the drum head is hit and a 'snare' sound to play when a centre of the drum head is hit. Thus because the signal processor is able to determine where a hit has occurred, many different sounds may be played using only one drum head. Any other variation may be assigned to different areas of a drum head, Embodiments advantageously provide for accurate position sensing of a hit.

The signal processor may further configured to process the detected level of RF signal to determine one or both of how hard the drum head is hit and a time duration of contact with the drum head when the drum head is hit. Advantageously this provides for a more responsive electronic drum compared to an electronic drum that has only a binary on/off response to a hit. The signal processor may process one or more of: a determined max velocity of the drum head; acceleration of the drum head; and total distance travelled by the drum head, to determine how hard the drum head is hit. The duration of contact may be determined by processing a measured displacement of the drum head before the drum head starts to move back towards its undisplaced position (i.e. a position of the drum head prior to being hit). The contact may be between an implement, such as a drum stick, and the drum head. The contact may be between a the user, for example a finger of a user, and the drum head The detected level of RF signal may define a drum head response waveform, and wherein the signal processor may be configured to determine both a radial position of the hit on the drum head and a velocity of the drum head from the drum head response waveform of a single drum sensor. Advantageously, this allows both a radial position of a hit and a drum head velocity (in response to a hit) to be determined by having only one drum sensor. This provides cost advantages because an electronic drum with many different responses (i.e. dependent on a position of a hit and/or velocity of the drum head) may be provided with only a single drum sensor rather than multiple drum sensors. Being able to provide such a responsive drum with only a single sensor further provides for a simpler, more efficient manufacturing process compared to a drum with many sensors. The signal processor may compare the determined drum head response waveforms with drum head response waveform templates stored in a memory of the electronic drum.

For example, the electronic drum may store ten different templates which correspond to expected drum head response waveforms for ten different hits (i.e. where the hits are made at different radial positions and/or hardness of hit), the signal processor may then be configured to compare the defined drum head response waveform to the stored drum head response waveforms, find the closest match, and then determine that the hit was made at a radial position (and/or the hit was a particular hardness) that correlates to the radial hit (and/or hardness of hit) associated with the closest match of the stored drum head response waveform.

The detected level of RF signal from the drum sensor may define a drum head response waveform, wherein the electronic drum may comprise two or more of the drum sensors, and wherein the signal processor may be configured to determine one or both of a difference in amplitude and a difference in timing between the drum head response waveforms of the two or more sensors to determine a position of the hit on the drum head.

Having two or more drum sensors may provide for improved accuracy of determination of a position of a hit compared to a drum with one drum sensor. This is because a drum having two drum sensors may determine an exact position of a drum hit on the surface of the drum rather than determining only a radial position (where a radial position is a distance from the centre of the drum). This advantageously provides for the possibility of assigning many more sound characteristics to different parts of the drum head, for example, four different drum sounds may be triggered by hits in four different quadrants of a drum having two drum sensors because the drum is configured to determine a position of the hit. The amplitude may be defined as the amount between a zeroed level of the drum head response waveform to a maximum level of the drum head response waveform.

The electronic drum may comprise a drum sound generation system coupled to the signal processor. The drum sound generation system may be configured to select a digitized drum sound sample for audio output in response to an output from the signal processor. Advantageously, the output of the electronic drum may be compatible to be used with a drum sound generation system, or more generally a sound generation system. The drum sound generation system could utilize sound samples stores as audio files and/or could use a synthesizer to generate sounds. This provides for sound to be output in response to a user interaction (e.g. a hit) with the electronic drum.

The drum sensor may comprise a deformable separator element between the active resonant circuit and the passive resonant circuit, and wherein the passive resonant circuit, the deformable separator element and the active resonant circuit may define a drum sensor stack with a mechanical path between the passive resonant circuit and the active resonant circuit. The deformable separator may be configured to optimize the vibrational response of a drum head to a hit.

The drum sensor may be configured to support the drum head. This may provide for increased durability of the electronic drum. Additionally, if the drum sensor is supporting the drum head, the drum sensor may have increased sensitivity to a drum hit because the drum sensor and the drum head may be more strongly mechanically coupled than if the drum sensor was not supporting the drum head.

The drum sensor stack further may comprise an interposer element positioned between the drum head and the passive resonant circuit, to protect the passive resonant circuit. The interposer may be referred to as a spacer and/or a protective element.

The electronic drum may comprise multiple user-interchangeable interposer elements, to enable a user to change adjusting the distance between the drum head and the passive resonant circuit. This advantageously provides for an electronic drum that is accurate across a wide range of uses, for example a small (relatively thin) interposer may be used when a user is hitting the drum head with a finger (i.e. a low force hit) whereas a large (relatively thicker) interposer may be used when the user is hitting the drum head with a stick (i.e. a high force hit).

The electronic drum may comprise multiple drum sensors positioned at different locations on the drum head, and wherein the interposer element may be shared between the multiple drum sensors. A shared interposer allows for all of the sensors to be protected by the same interposer meaning that the user can interact with the entirety of the drum in a uniform manner. Having a shared interposer may also provide for a simplified manufacturing process compared to an electronic drum having separate interposers for each drum sensor.

The electronic drum may comprise multiple drum sensors positioned at different locations on the drum head, wherein one of the multiple drum sensors may be positioned at a centre of the drum head and at least one of the multiple drum sensors may be positioned adjacent to an edge of the drum head. Such positioning of sensors provides for accurate sensing of hits across the entire surface of the drum head.

The sensing system may further comprise a multiplexing system to multiplex the RF drive signals for the drum sensors such that simultaneously driven drum sensors positioned adjacent to an edge of the drum head may be separated by at least one drum sensor in a radial direction. Advantageously, by separating drum sensors that are active at the same time, interference between the two drum sensors is reduced. This provides for a high level of accuracy of the drum sensors.

The drum head may comprise a drum head lip around an edge of the drum head, and the bottom member may comprise a bottom member lip around an edge of the bottom member, and wherein either: the lip the drum head may be configured to fit inside the lip of the bottom member, or the lip the bottom member may be configured to fit inside the lip of the drum head. In this sense the drum head may for a complete unit with the bottom member. This may provide for increased durability of the electronic drum because all of the components are held together.

The electronic drum may comprise multiple drum sensors, and a temperature-compensation system to temperature-compensate the detected level of RF signal, wherein the temperature-compensation system may be configured to apply an off-resonance drive signal to at least one of the active resonant circuits of the multiple drum sensors, to measure a level of the off-resonance drive signal from at least one detector of the multiple drum sensors, and to compensate the detected level of RF signal responsive to the level of the off-resonance drive signal.

An electronic drum may be moved between different environments having different temperatures, for example, it may be moved from a studio to a concert venue (each having different and/or varying temperatures). The temperature compensation system is therefore advantageous because it provides for a drum sensor that is accurate across a range of temperatures.

The active resonant circuit may comprise a coil with windings in opposite senses, in particular wherein the windings in opposite senses are configured to generate magnetic fields in opposite senses to cancel one another. This allows for more accurate readings for a drum comprising multiple drum sensors. Additionally, as there is lower interference due from other drum sensors due to the canceling of the magnetic fields, the drum sensors may be able to operate at a lower power because of the lower interference from other drum sensors. In other words, as there is less noise, the drum sensor can run at a lower power and maintain an equivalent signal to noise ratio compared to a drum without coils with windings in opposite senses. Therefore there are power efficiency savings because each drum sensor can be driven with a lower power.

Each of the passive resonant circuit and the active resonant circuit may comprise a coil with first and second windings in opposite senses, and wherein the first and second windings may be on opposite sides of a central axis of the drum sensor. This provides for a lower amount of interference between drum sensors. For at least the reasons discussed above, this therefore provides for power efficiency savings because each drum sensor can be driven with a low power.

The electronic drum may further comprise: a backplane on the bottom member, wherein the backplane bears a plurality of the active resonant circuits each comprising a respective coil with one or more windings, each for a respective drum sensor; and the signal processor is configured to process the detected level of RF signal to sense a position and/or velocity of the drum head defining a drum head response associated with the drum sensor; wherein the signal processor is configurable to adjust the drum head response of one or more of the drum sensors, individually or in groups, to configure the sensitivity of the drum sensors to motion. Advantageously, this provides for an electronic drum having different drum sensors that are configurable to have different sensitivities to motion. A user may wish to be able to trigger a sound on a left side of the drum with minimal contact (e.g. using a finger tap) but have the right ride triggered only in response to a larger amount of contact (e.g. a drum stick hit). By providing an electronic drum that allows a user to specify the sensitivity of specific drum sensors, such advanced configuration is provided for.

The electronic drum may comprise non-volatile memory associated with the signal processor to store sensitivity configuration data defining the sensitivity of the drum sensors, individually or in groups, and may comprise an interface to enable one or more of: user definition of the sensitivity configuration data, import of the sensitivity configuration data, and export of the sensitivity configuration data.

The electronic drum may include a backplane, wherein the backplane may bear a plurality of the active resonant circuits each comprising a respective coil with one or more windings, wherein at least some of the active resonant circuits are paired such that in a pair of the active resonant circuits a configuration of the one or more windings of a coil of one of the active resonant circuits is of opposite sense to a configuration of the one or more windings of a coil of the other of the active resonant circuit.

The electronic drum may comprise the at least one sensor driver, wherein the active resonant circuits are arranged in spatial groups and wherein, for all the active resonant circuits in a spatial group, the one or more windings of the coils of the active resonant circuits have the same sense, wherein adjacent spatial groups the one or more windings of the coils of the active resonant circuits have opposite senses, and wherein within a spatial group the active resonant circuits are multiplexed such that are driven sequentially in time. There may be spatial groups arranged within a single drum head. There may be spatial groups arrange across multiple drum heads.

The electronic drum may comprise a plurality of drum heads each with multiple drum sensors, and may comprising a multiplexing system to multiplex the RF drive signals for the drum sensors such that simultaneously driven drum sensors are in different drum heads and/or separated by at least one drum sensor in at least one of two orthogonal directions or in a radial direction. Advantageously, by avoiding having two adjacent drum sensors active at the same time, interference between the two drum sensors is reduce.

In another aspect a sensing system is provided to sense pressure for an electronic drum pad. The sensing system may comprise a plurality of drum pad sensors. Each sensor may comprise a passive resonant circuit, and an active resonant circuit, the passive resonant circuit having a resonant frequency, the active resonant circuit being configured to excite the passive resonant circuit at the resonant frequency. Each sensor may further comprise a deformable element e.g. a block or layer of rubber, below and/or between of one or both of the passive resonant circuit and the active resonant circuit. The sensing system may further comprise at least one sensor driver to drive the active resonant circuits with an RF drive signal at the resonant frequency. The sensing system may further comprise at least one detector to detect a level of RF signal from a driven sensor for sensing a position and/or velocity of the associated drum pad e.g. to determine when or where the pad is hit. The sensing system may further comprise a multiplexing system e.g. configured such that no sensor is driven at the same time as an adjacent sensor e.g. in each of two dimensions.

There is also provided a non-transitory data carrier, such as non-volatile memory, carrying code and/or data to implement functions described above. The code/data may comprise source, object or executable code in a conventional programming language, interpreted or compiled, or assembly code, code/data for setting up or controlling an ASIC or FPGA such as code for a hardware description language such as Verilog (Trade Mark). As the skilled person will appreciate such code and/or data may be distributed between a plurality of coupled components in communication with one another.

Other aspects of the system are described below. These may be combined with those described previously.

At least the active resonant circuit, and optionally also the passive resonant circuit, may comprise one, two or more coils, in particular with windings in opposite senses. Thus, for example, the windings may generate magnetic fields in opposite senses, in particular balanced or matched to cancel one another, in particular at long distances from the sensor In implementations the combination of coils with opposite sense windings (and hence opposite sense currents/magnetic fields) and multiplexed sensor addressing facilitates the use of multiple sensors in close proximity. Thus in implementations the windings in opposite senses are configured to generate balanced magnetic fields in opposite senses, which may cancel one another substantially completely at large distances from a sensor, for example at a distance of at least ten times a maximum coil dimension (which is not to say that the RF field from a sensor is undetectable at such a distance).

In some implementations the active resonant circuit comprises a pair of, or three or more, laterally adjacent pancake coils. (As used herein references to two or more coils may be taken to include one coil with two or more windings, for example where the windings are in opposite senses). The pancake coils may be formed on a printed circuit board (PCB), which may be a flexible PCB, for ease of fabrication. The coils may, but need not have windings in opposite senses—some reduction in mutual interference may be obtained simply by employing this configuration of coils.

In implementations system, in particular the multiplexing system, is configured to damp the active resonant circuits of drum sensors which are not driven, for example by shorting a coil/sensor and/or driving it with an off-resonance signal, e.g. a low frequency or DC signal. This also facilitates using resonant circuit-based sensors by reducing interference between sensors.

One or more of the above described techniques may be employed to limit interference between nearby drum sensors. Which, and how many, techniques are employed may depend in part upon the distance between the active and passive resonant circuits when a drum is in a quiescent position (up, and/or taught and or not hit) and/or the distance of travel between a drum hit positon and a quiescent position. Thus in general, some implementations of the sensing system may employ a multiplexing arrangement as described herein and some additional means to reduce interference between nearby sensors.

The sensing system may further comprise a temperature-compensation system to temperature-compensate the detected level of RF signal. The temperature-compensation system may be configured to apply an off-resonance drive signal to at least one of the active resonant circuits. It may then measure a level of the off-resonance drive signal from the at least one detector, and it may then compensate (e.g. offset) the detected level of RF signal responsive to the level of the off-resonance drive signal. In some implementations the multiplexing system is configured to multiplex the drive signal such that one of the drum sensors is driven in each of a set of time slots. Then the temperature-compensation system may be configured to apply the off-resonance drive signal during an additional time slot, in particular a time slot not used for drum interrogation.

In some implementations each drum sensor may further comprises a resilient deformable element, for example below one of the resonant circuits, for example a deformable end stop, or between the resonant circuits, in particular to limit motion of one or both of the passive resonant circuit and the active resonant circuit for pressure sensing, in particular by detecting motion against the resilient deformable element.

In a related aspect there is provided a method of periodically compensating a response of an electronic drum comprising one or more drum heads. Each drum head may have a sensor comprising an active resonant circuit, a passive tuned resonant circuit and a detector. The method may comprise retrieving from storage a detected initial output signal of the sensor, $O_{r1}$, at a first time, $t_0$, wherein at to the active resonant circuit is being driven at a frequency below a resonant frequency of the active resonant circuit. The method may further comprise, periodically, for at least one of the sensors, detecting a later output signal of the sensor, $O_{r1}$, at a time after $t_0$. The method may then calculate an adjustment value, for example a difference between the initial output signal of the sensor and the later output signal of the sensor. The method may then further comprise compensating the response of the drum head by adjusting an operational output of the sensor using the adjustment value. The operational output may be an output from the sensor when the active resonant circuit is being driven at the resonant frequency of the active resonant circuit. The method may further comprise operating the sensor according to a time division multiplexed addressing scheme. The method may then using a "spare" time slot of the time division multiplexed addressing scheme, in which the sensor is not operational, for the detecting.

In another aspect there is provided a set of sensors for an electronic drum. The drum may have a plurality of drum heads. The set of sensors may be part of a sensing system. Each sensor may comprise a passive resonant circuit for mounting on a moving part of a drum (i.e. the drum head) and an active resonant circuit for mounting in a fixed, reference position. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the drum head. The variation may, in some implementations, be a variation in amplitude of signal in the resonant signal. The set of sensors may comprise sensors having two or more different resonant frequencies arranged such that sensors having the same resonant frequency are non-adjacent on the drum head.

Embodiments of this approach can be relatively inexpensive to construct but are also reliable and not prone to the sensor bounce of mechanical switches, which in turn enables them to respond to hits and the resultant movements of the drum head very quickly and reliably. For example ideally each drum head would be measured at a rate of at least 250 times per second, and on, say, a set of 5 drums each with 6 sensors this corresponds to 7500 sensing events per second. The system can also provide excellent temperature stability, and is non-contact so robust and substantially immune to contamination. Some implementations of the sensors are further able to determine a drum head position as it moves between a stationary position and a final displaced position following a hit, prior to vibrating, and may provide a substantially continuous determination of drum head position. The reference position may be a fixed position beneath the drum head, for example on a bottom member on which the active tuned resonant circuit is mounted or it may be a position on a printed circuit board (PCB) carrying the set of sensors for the drum. Alternatively however, in some implementations the active resonant circuit may be mounted on or in association with a drum head and the resonant circuit may be mounted on the base, PCB or similar.

Some implementations of the sensors are also able to detect when a drum head moves beyond a drum head pressed position, and hence are useful in implementing detection of the pressure applied to a drum head.

The sensors can further sense drum head velocity, and/or sensed drum head velocity may be employed to determine drum head position.

In some implementations sensors having a first resonant frequency are interleaved with sensors having a second, different resonant frequency, for example using alternate frequencies on alternate drum sensors. This helps to reduce inter-sensor interference.

The set of sensors may include a controller to control selection or scanning of the sensors such that adjacent drum sensors are selected at different times, again to reduce inter-sensor interference. In some implementations the controller may damp the response of active resonant circuits of unselected drum sensors, for example by connecting part of the active resonant circuit to ground, for example via a resistor. The controller may comprise a multiplexing system and/or a microprocessor.

In some implementations the controller/multiplexing system may be configured to time division multiplex operation of the sensors. In such an approach each resonant frequency may define a group of sensors, and the time division multiplexing may define a plurality of n time slots. Successive drum sensors, for example of each group, are allocated successive time slots. The successive sensors, for example of each group, may be non-adjacent if sensors of the groups of sensors are interleaved. There may be N resonant frequencies and thus N groups of sensors; In some implementations N=1. In some implementations, after activating a sensor of a current group of sensors in a current time slot the controller may in the next time slot activate the next sensor which is in the same group of sensors e.g. on the same drum head.

Preferably the controller/multiplexing system is configured such that adjacent sensors are not active simultaneously, although next-to-adjacent sensors may be active simultaneously. The spacing between simultaneously active sensors may be $(m \times N)+1$ where m is in the range 1 to n/2; higher separations are preferred (where a spacing of 1 refers to adjacent sensors).

The closest physical spacing for simultaneously active sensors in the same group may be a spacing of n×N sensors, later referred to as a subset of sensors, since typically a drum head or drum set (i.e. a set of drum heads) will have more than one such subset. Thus the controller/multiplexing system may be configured such that drum sensors in the same group and activated in the same time slot have $(n \times N)-1$ sensors between them. In some implementations n may be 8 and N may be 2.

The controller may be implemented using a processor coupled to an addressing device such as a digital demultiplexer to address the sensors; a signal may be read from the addressed sensors by selectively connecting a sensor active resonator to a read-out circuit via an analogue multiplexer. The detector, i.e. read-out circuit, may perform an envelope detect function. The read-out circuit and/or analogue multiplexer may be enabled by an enable signal derived from a drive signal to an active resonator, in some implementations via an adjustable phase shift. The adjustable phase shift may be used, in the context of or separately from such a demultiplexer-multiplexer arrangement, to implement synchronous detection of the signal from an active resonant circuit.

The controller or another processor may be configured to process the variation of the resonant signal in the active resonant circuit of each sensor to determine the motion of each sensor of the drum head over a succession of time intervals as a depressed sensor moves between released and depressed positions, when a sensor is depressed and/or released. The motion of each sensor may comprise a position and/or an approximate velocity of the sensor as the sensor moves between released and depressed positions.

In some approaches the position of a sensor may be determined from the velocity of a drum head/sensor, for example by integration, rather than directly. The processor may output data defining a profile of approximate position and/or velocity over time for each sensor or for each moving drum head/sensor.

In some implementations the processor is configured to process the variation of the resonant signal in the active resonant circuit of each sensor to determine the approximate velocity of a sensor from changes in position of the sensor determined at successive time intervals. A velocity determined in this way may be filtered dependent upon sensor velocity, for example applying greater filtering/smoothing when a sensor is moving slowly. This helps to provide accurate data when a sensor is moving slowly without significantly compromising the response time for a fast-moving drum head/sensor.

More generally a processor may process the amplitude and/or other variation of the resonant signal to determine a drum head/sensor-hit and drum head/sensor-released event for each drum head/sensor, for example from a determination of sensor position and/or velocity. The processor may thus output a press/release event signal for each drum head/sensor/each active drum head/sensor.

In some approaches the succession of sensor positions or sensor movement profile may be used to predict when a pressed (or released) sensor reaches a drum head/sensor-hit (or drum head/sensor-released) position, for example by extrapolating a trajectory of the sensor position. The predicted position may be the position later referred to as K. The processor may then issue a drum head/sensor-hit (or drum head/sensor-released) signal in advance of the actual drum head/sensor-hit (or drum head/sensor-released) position being reached. This can be advantageous for compensating in processing delays, for example latency in a sound generating system.

In some implementations the succession of sensor positions or sensor movement profile may be used to provide signals to the computer, for example to control aspects of a generated sound, before and/or after a drum head/sensor-hit event has been issued, or instead of issuing drum head/sensor-hit and drum head/sensor-released events.

In some implementations the processor may be further configured to distinguish between at least three different sensor positions, a first, drum head/sensor-released position, a second, drum head/sensor-hit position, and a third, aftertouch position. The aftertouch position may be beyond the drum head/sensor-hit position and correspond to additional pressure applied to the sensor after depression. The processor may determine a position and/or velocity of the sensor as it moves to/from the aftertouch position, for example to act as a variable pressure sensor, or the processor may simply identify when the aftertouch position is reached. The aftertouch position may correspond to motion of a sensor beyond its usual depressed position as a result of the application of additional pressure to the drum head/sensor. Each sensor may be provided with a resilient bias or deformable end-stop device such as a compression or tension spring or compressible element or block, so that on depression part of the sensor interacts with the device and is inhibited from further motion by the device unless additional pressure is applied to the drum head/sensor, whereupon the sensor moves towards its aftertouch position. An aftertouch position may be detectable for each drum head/sensor.

A pressure-control sensor movement distance (dead-zone) may be provided between a maximum drum head/sensor-hit position and the start of aftertouch detection, for example to allow the amount of pressure required before aftertouch begins to be configured.

The set of sensors may be provided on a substrate such as a printed circuit board. The sensors may be disposed in a two-dimensional array along the substrate, in particular at locations which correspond to locations of drum head/sensors of the drum/set, more specifically adjacent where the passive resonant circuits are located on the drum/set. Coils for the active resonant circuits may be formed by tracks on the substrate, for example defining pancake coils. A set of sensors may comprise sensors for a complete drum head/set or for part of a drum head or drum set. There is also provided a drum head/set comprising one or more the sets of sensors as previously described.

In general a processor/controller of the set of sensors may be any sort of processing device/circuitry, for example comprising one or more of: a microprocessor under program code control, or a digital signal processor (DSP), or hardware such as an FPGA (field programmable gate array) or ASIC (application specific integrated circuit). In some implementations the control/processing functions for a set of sensors may be provided in a single integrated circuit.

Where a programmable device is employed the processor may have associated working memory and non-volatile program memory storing processor control code to control the processor to implement some or all of the functions described above. Thus there is also provided a non-transitory data carrier, such as non-volatile memory, carrying code and/or data to implement functions described above. The code/data may comprise source, object or executable code in a conventional programming language, interpreted or compiled, or assembly code, code/data for setting up or controlling an ASIC or FPGA such as code for a hardware description language such as Verilog (Trade Mark). As the skilled person will appreciate such code and/or data may be distributed between a plurality of coupled components in communication with one another.

There is also provided a method of sensing the positions of a plurality of sensors, for example of a drum head/set. The method may comprise providing each sensor with a sensor comprising a passive resonant circuit for mounting, for example, on a moving part of a sensor and an active resonant circuit for mounting, for example, in a fixed, reference position, for example part of the drum head/set. In some implementations the passive resonant circuit has a resonant frequency, the active resonant circuit exciting the passive resonant circuit at the resonant frequency. Each sensor may further have a detector, which may be shared, to detect variation of a resonant signal in the active resonant circuit with relative position of the active and passive resonant circuits to detect a position and/or velocity of the drum head/sensor. The method may further comprise arranging the sensors to operate at two or more different resonant frequencies arranged such that drum sensors having the same resonant frequency are non-adjacent. Additionally or alternatively and/or the method may further comprise reducing interference between sensors by configuring one or more coils of at least the active resonant circuits, and optionally also of the passive resonant circuits, to have windings in opposite senses.

There is further provided a drum head/set providing an output signal derived from measurements of the position and of the velocity and of the pressure applied to a plurality of sensors of the drum head/set. The measurements may be derived from drum sensor on the drum head. Each drum sensor may comprise an active tuned resonant circuit; drive electronics coupled to the active tuned resonant circuit to drive the active tuned resonant circuit at a resonant frequency, optionally shared between sensors; and an electrically reactive element associated with the drum head/sensor. The electrically reactive element may provide a variable modification to a response of the active tuned resonant circuit dependent on a relative position of the electrically reactive element with respect to the active tuned resonant circuit. The electronic drum/sensing system may further comprise read-out electronics coupled to the active tuned resonant circuit, to provide a variable output signal responsive to the relative position of the electrically reactive element with respect to the active tuned resonant circuit. The variable output signal of the read-out electronics may provide the drum sensor output.

Preferably, but not essentially, the electrically reactive element comprises a passive tuned resonant circuit tuned to a frequency at which the active tuned resonant circuit is driven, thus the drum sensor is operated at a single resonant frequency. Advantages to this approach include: Firstly, a larger effective sensing distance can be achieved for a given size of drum sensor. Secondly, a larger variation in the output signal of the drum sensor for a given variation in sensed position can be obtained, often removing the requirement of an output amplifier for the drum sensor and thus reducing complexity and cost. Thirdly, operation of a plurality of proximally located drum sensor is facilitated a passive tuned resonant circuit of a first drum sensor tuned to the resonant frequency of the first drum sensor does not substantially affect the output of a second drum sensor if the second drum sensor is tuned to a significantly different resonant frequency to that of the first drum sensor.

In broad terms an example range of resonant frequencies is 1-10 MHz, balancing speed against the deleterious effect of parasitics. For example a first resonant frequency may be in the range 3-4 MHz and a second resonant frequency may be in the range 4-5 MHz.

A particularly advantageous means of forming coils used by the active tuned resonant circuit and passive tuned resonant circuit has been found to be a flat or planar coil defined by tracks on a printed circuit board. This helps achieve a well-defined repeatable geometry and facilitates other electrically active components being proximally located on the printed circuit board.

To minimise electro-magnetic emissions radiated from the drum sensor and to minimise susceptibility to electro-magnetic interference signals of said drum sensor, the coils of the active tuned resonant circuit may be formed from a plurality of electrically connected primary "smaller" coils wherein the winding direction of said primary smaller coils is chosen such that the sum of the electro-magnetic far field radiated from said primary smaller coils is substantially zero. In this case the inductance coils used by the passive tuned resonant circuit may: be inductively coupled to only a subset of said primary smaller coils; or be comprised of a plurality of electrically connected secondary smaller coils wherein the winding direction and number of said secondary smaller coils may be chosen to maximise the variation in the output signal of said drum sensor.

BRIEF DESCRIPTION OF THE DRAWINGS

In the Figures some like elements are indicated by like reference numerals.

DETAILED DESCRIPTION

Figure 1A:
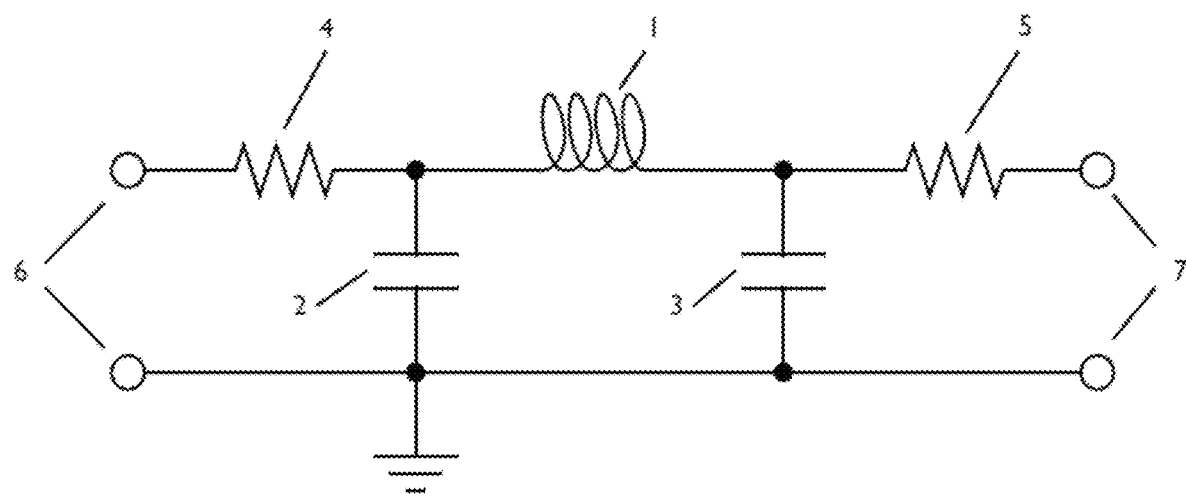
FIGS. 1a and 1b show, respectively, an active tuned resonant circuit and a passive tuned resonant circuit for use with example implementations of the system.

Referring to FIG. 1a, an active tuned resonant circuit comprises an input resistive element 4, a coil 1, two capacitive elements 2 and 3, an output resistive element 5, a means of connecting 6 drive electronics to the input resistive element and a means of connecting 7 read-out electronics to the output resistive element. The input resistive element may be omitted, but it is preferred because: it limits the current supplied to the active tuned resonant circuit from the drive electronics which reduces the operating current and thus reduces both power consumption and electro-magnetic emissions from the active tuned resonant circuit; and it increases the sensitivity of proximity detection when the read-out electronics are connected to the active tuned resonant circuit. The output resistive element may be omitted, but it is also preferred because the input and output resistive elements reduce the effect of connecting wires on the impedance of the active tuned resonant circuit thus allowing all the sensors to be essentially the same regardless of the length of connections to the drive electronics and to the read-out electronics.

Figure 1B:
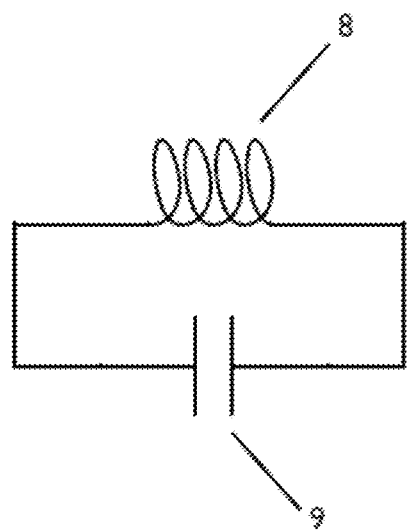

Referring to FIG. 1b, the reactive element preferably comprises a passive tuned resonant circuit which comprises a coil 8 and a capacitive element 9 wherein the coil and the capacitive element are connected to form a closed resonant LC circuit. It is not necessary for the size nor for the value of inductance of the coils 1 and 8 to be substantially similar. The value of the capacitance of the capacitive element 9 is preferably chosen to tune the frequency of resonance of the passive tuned resonant circuit to match the frequency of resonance of the active tuned resonant circuit of FIG. 1a. When the passive and active circuits are thus tuned, it is possible to operate a plurality of sensors where proximally located the sensors are tuned to substantially different frequencies of resonance thereby minimising the interaction between the proximally located sensors. Furthermore when the passive and active circuits are thus tuned the signal amplitude at output 7 in FIG. 1a decreases as the distance between the passive and active circuits decreases because more energy is coupled to and dissipated by the passive tuned resonant circuit. Such variation in the signal amplitude is preferred because measuring variations in signal amplitude is faster than measuring variations in frequency of resonance as would be implemented in the case where the active tuned resonant circuit was detuned by proximity to the reactive element.

The drive electronics comprises a generator of an oscillating voltage drive waveform at a frequency equal to or close to the frequency of resonance of the active tuned resonant circuit. Typically, by way of example, this waveform is a square waveform generated by the output of a microcontroller timer or a digital or analogue timing circuit.

The read-out electronics comprise a means of generating a voltage proportional to the amplitude of the signal at the read-out point 7.

Figure 2:
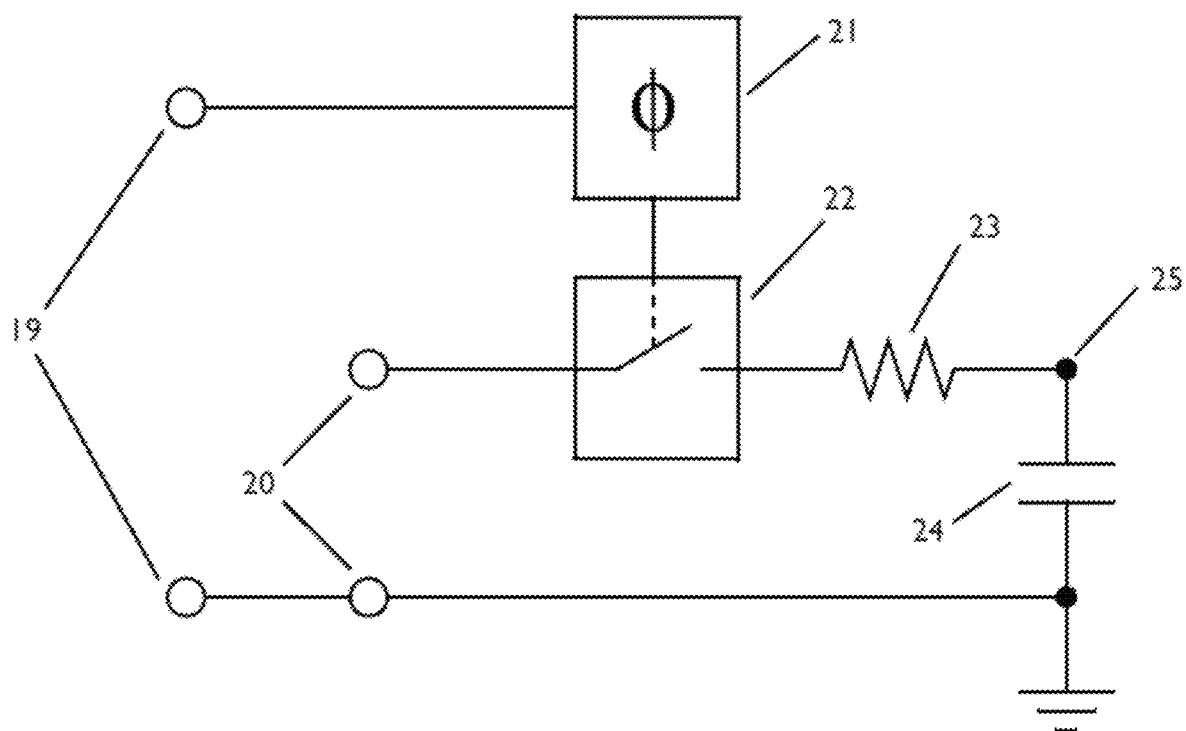
FIG. 2 shows an example of a read-out electronic circuit comprising a synchronous demodulator for use in example implementations of the system.

Referring to FIG. 2, by way of example, the read-out electronics may comprise a synchronous demodulator circuit. For example the signal from the read-out point is connected to point 20 and demodulated e.g. by an analogue switch 22 controlled by the oscillating voltage drive waveform connected to 19 whose phase is optionally adjusted by a phase shifting element 21. A low-frequency (or dc) voltage is presented at output point 25 by a low-pass filter e.g. comprising a resistive element 23 and a capacitive element 24. Alternative read-out electronic circuits may comprise phase-sensitive rectifiers, phase-insensitive rectifiers, non-synchronous demodulators, peak detectors, or the like.

The coils 1 and 8 used in the active tuned resonant circuit and the passive tuned resonant circuit respectfully can be of any type. However using planar spiral coils formed by tracks on a printed circuit board has three main advantages: they are inexpensive, they can be made with highly reproducible values of inductance and the printed circuit board can also be used to mount the other components, namely the capacitive elements 2, 3 and 9, and the resistive elements 4 and 5. It is therefore possible to design a plurality of coils whose inductance values are closely matched.

Figure 3A:
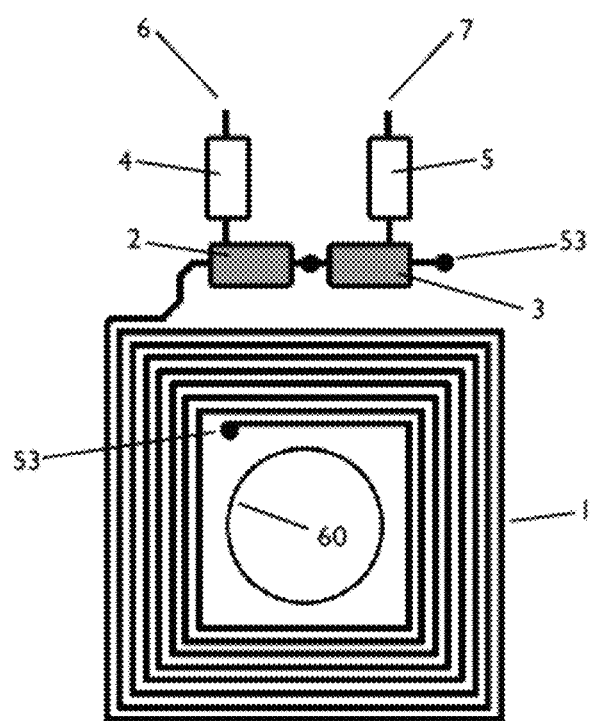
FIGS. 3a and 3b show, respectively, example printed circuit designs for the active tuned resonant circuit and for the passive tuned resonant circuit.

Referring to FIG. 3a, an example active tuned resonant circuit may be formed on a printed circuit board comprising a single electrically conductive layer or a plurality of electrically conductive layers. In implementations the coil 1 is formed of a continuous spiral track whereby electrical continuity of the track is maintained by electrical connection through connecting vias 53 to a connecting wire or to another spiral track on another conductive layer or to a plurality of spiral tracks on a plurality of conductive layers of the printed circuit board; capacitive elements 2 and 3 and resistive elements 4 and 5 are proximally located; and connection points 6 and 7 are provided for drive electronics and read-out electronics, respectively.

In some implementations the active tuned resonant circuit may be formed on a backplane. The backplane may comprise a printed circuit board. In some implementations the backplane is provided with an aperture 60 to accommodate part, e.g. a projection, of an actuator block, for alignment.

Figure 3B:
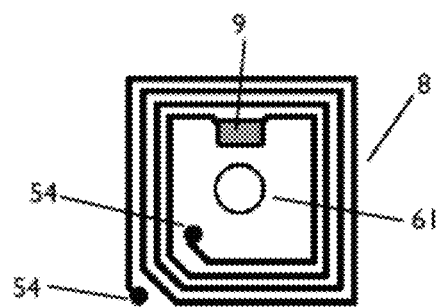

FIG. 3b shows an example passive tuned resonant circuit that may be formed on a printed circuit board comprising a single electrically conductive layer or a plurality of electrically conductive layers. In implementations the coil 8 is formed of a continuous spiral track whereby electrical continuity of the track is maintained by electrical connection through connecting vias 54 to a connecting wire or to another spiral track on another conductive layer or to a plurality of spiral tracks on a plurality of conductive layers of the printed circuit board; and the capacitive element 9 is proximally located.

In some implementations the passive tuned resonant circuit forms part of drum head sensor and may be formed on a printed circuit board. The printed circuit board may have an optional aperture or depression 61 to facilitate mounting of the sensor.

The electro-magnetic emissions from an active tuned resonant circuit, and the susceptibility to electro-magnetic interference signals of the active tuned resonant circuit can be substantially reduced when the inductive coil of the active tuned resonant circuit is formed from a plurality of electrically connected primary smaller coils wherein the winding direction of the primary smaller coils is chosen such that the sum of the electro-magnetic far field radiated from the primary smaller coils is substantially zero.

Figure 4A:
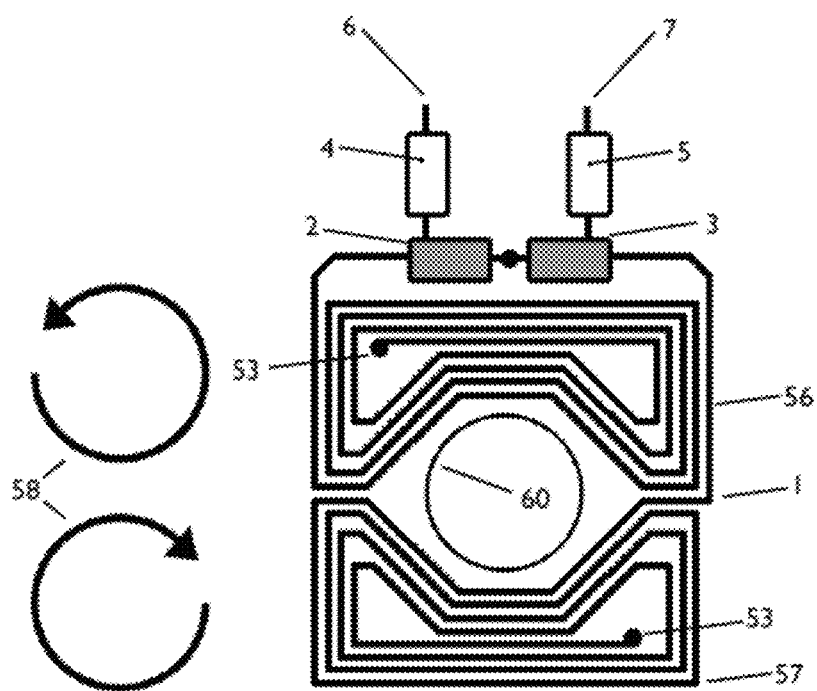
FIGS. 4a and 4b show examples of sensor resonant circuits with coils having windings in opposite senses for, respectively, the active tuned resonant circuit and the passive tuned resonant circuit.

One example of the inductive coil 1 is shown in FIG. 4a, wherein two primary smaller coils are wired in series with opposing winding directions 58 to form, approximately, a figure-of-eight coil. In such an arrangement the electro-magnetic far field radiated from the first half of the figure-of-eight coil 56 is equal in magnitude but with opposite polarity to the electro-magnetic far field radiated from the second half of the figure-of-eight coil 57, thus the electro-magnetic far field radiated from the figure-of-eight coil is substantially zero.

In such an arrangement, a passive tuned resonant circuit as shown in FIG. 3b may be ineffective unless the inductive coil of the passive tuned resonant circuit is primarily inductively coupled to only one half 56 or 57 of the figure-of-eight coil of the active tuned resonant circuit.

Figure 4B:
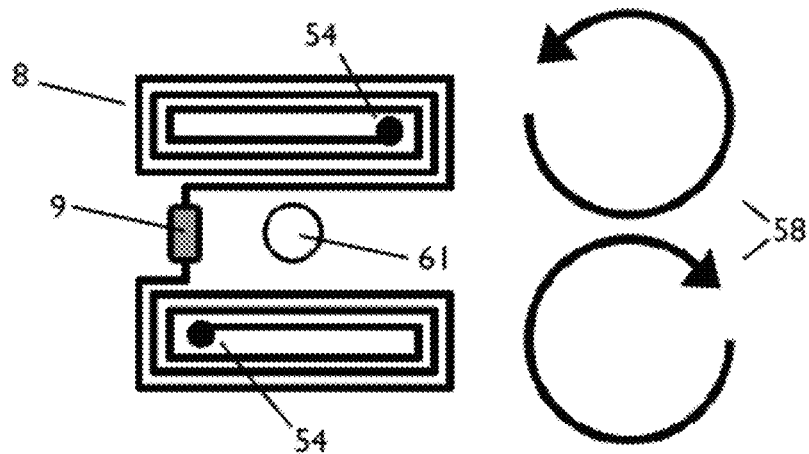

To maximise the output signal of the sensor, the inductive coil of the passive tuned resonant circuit may be similarly formed of a figure-of-eight inductive coil, as shown in FIG. 4b, e.g. comprising two secondary smaller coils wired in series with opposing winding directions 58 wherein each the secondary smaller coil is primarily inductively coupled to a different primary smaller coil of the figure-of-eight coil of the active tuned resonant circuit.

Although a first passive tuned resonant circuit tuned to a first frequency of resonance of a first active tuned resonant circuit does not substantially affect the output of an adjacent second active tuned resonant circuit tuned to a substantially different second frequency of resonance, when a corresponding second passive tuned resonant circuit tuned to the second frequency of resonance is proximally located, movement of the first passive tuned resonant circuit may affect the output of the second active tuned resonant circuit due to mutual coupling between the first and second passive tuned resonant circuits. Such undesirable interaction can be minimised by offsetting the positions of physically adjacent passive tuned resonant circuits from a position they would otherwise occupy.

In some implementations sensors on the drum head of a drum or drum set are interrogated using a time-division multiplexing scheme in which a subset of sensors are enabled at any given time. For a drum set with a large number of sensors such as 16 or more, such a scheme can have advantages of reducing cost, complexity, power consumption and electro-magnetic emissions.

In the case where a first sensor operating at first frequency of resonance and a second sensor operating at a substantially different second frequency of resonance are proximally located the sensors can interact in such a way that the output of the first sensor and the output of the second sensor contains interference components which vary with a frequency of variation equal to the frequency difference of the first frequency of resonance and the second frequency of resonance. Synchronous demodulation of the output of the sensors substantially removes the interference components when the cut-off frequency of the reconstruction low-pass filter is substantially lower than the frequency difference. However, the time response of the low-pass filter can limit the speed of response of the sensors which is undesirable. Therefore, a mechanism to minimise this interference is desired. Using a time-division multiplexing scheme where physically adjacent sensors are not driven at the same time can avoid this problem.

However in practice it has been found that synchronous demodulation is not necessary for good performance.

In implementations where more than one active tuned resonant circuit is driven simultaneously, to reduce electro-magnetic emissions it can be advantageous to configure the winding direction of coils of the active tuned resonant circuits such that when simultaneously driven a proportion e.g. half of the coils have windings in one direction and the remaining the coils have windings in the opposite sense. Thus the sum of the electro-magnetic far field radiated from the coils may be substantially reduced compared to the coils all being wound in the same sense.

Figure 5A:
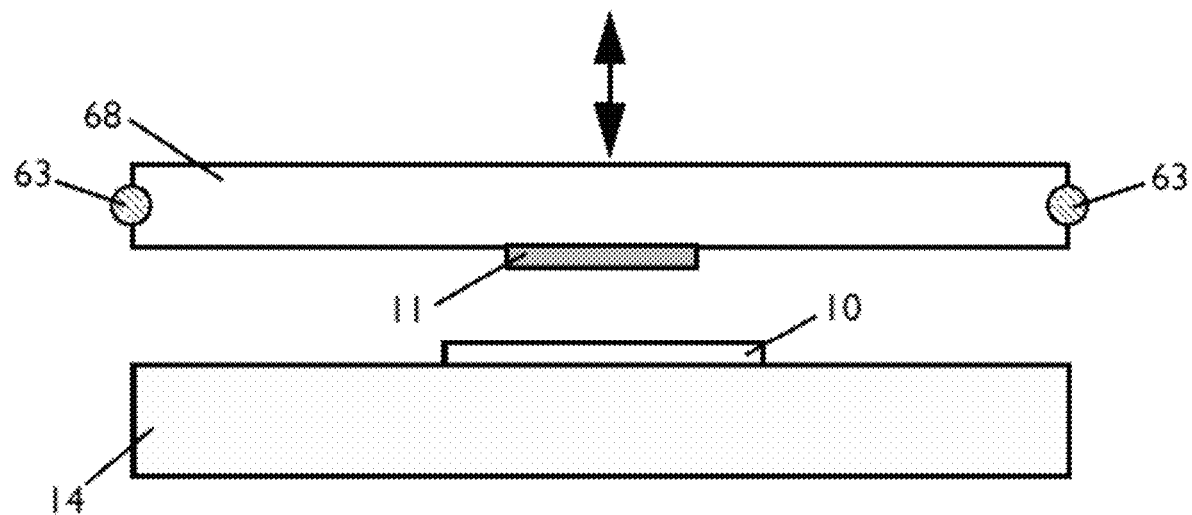
FIGS. 5a and 5b show examples of an electronic drum comprising a single drum sensors.

An embodiment of an electronic drum, shown in FIG. 5a and comprises a drum head (i.e. drum pad) 68 e.g. a flexible top member. In the FIG. 5a example movement of the perimeter of said drum head is constrained by a retaining mechanism 63. The passive tuned resonant circuit 11 is attached to the drum head.

The electronic drum comprises a drum sensor comprising the passive tuned resonant circuit 11 and an active tuned resonant circuit 10 mounted on a fixed bottom member 14. The active tuned resonant circuit 10 is inductively coupled to the passive tuned resonant circuit 11, providing a signal which varies as the mutual separation of the active tuned resonant circuit 10 and the passive tuned resonant circuit 11 is varied. Drive and readout electronics is connected to the active tuned resonant circuit.

The drum sensor of this and later described examples is configured to sense the vibrations of the drum head 68. However, in implementations the signal to noise ratio of the RF signal, generated in response to the vibrations of the drum head, may not be high enough to use the vibration direct as an audio signal output from the drum. Thus in some implementations the vibrations may be processed before use as an audio signal or merely used to detect when and/or how e.g. where the drum is hit, after which a drum sound may be synthesised or a sample drum sound played to provide an audio output. The synthesised/sampled sound may be varied according to detected characteristics of the hit. Thus in some implementations where the signal to noise ratio of the RF signal is not high enough to use as an audio output signal, just the initial transient of the vibration may be used (because the transient is much larger than the following vibrations) e.g. to trigger a sound such as a sample or a synthesizer.

Figure 5B:
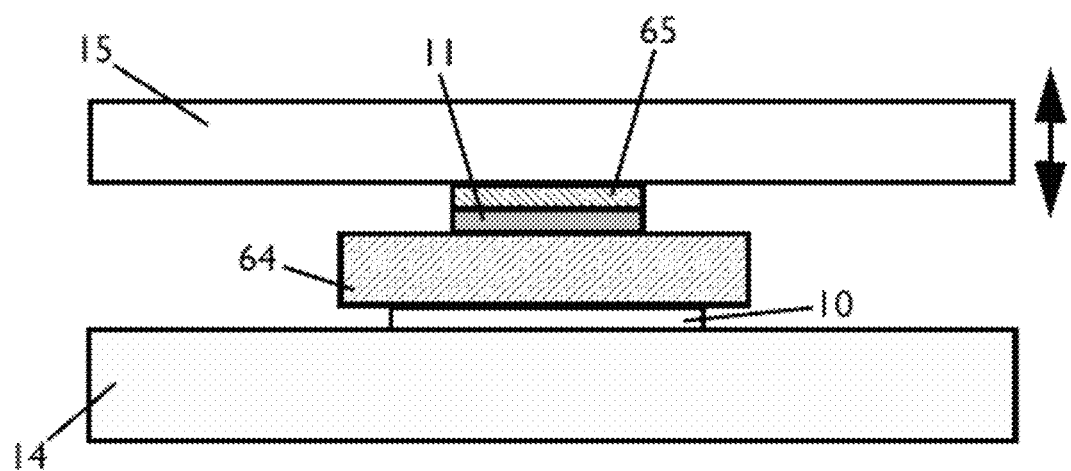

Referring to FIG. 5b this example drum has a drum head (i.e. drum pad) 15; a passive tuned resonant circuit 11; an optional interposer element 65; a deformable separator element 64; an active tuned resonant circuit 10; and a fixed bottom member 14. The interposer performs two functions: Firstly it limits the force applied to the passive tuned resonant circuit 11 by movement of the drum head 15 thus preventing damage to the passive tuned resonant circuit 11. Secondly it enables accommodation different distances of separation between said drum head and said passive tuned resonant circuit 11 (e.g. by enabling user selection of elements of different thickness). The deformable separator 65 e.g. an elastic block, permits movement of the drum head thereby allowing a corresponding movement of said passive tuned resonant circuit 11 and thus a variation in the mutual separation of said active tuned resonant circuit 10 and said passive tuned resonant circuit 11.

As discussed above, a variation in the mutual separation of said active tuned resonant circuit 10 and said passive tuned resonant circuit 11 causes an RF signal to be produced. The RF signal can be processed to determine when and where the drum head has been hit. Further characteristics such as how hard the drum was hit can be determined. In particular, the detected level of RF signal can be processed by the signal processor to determine a drum head response waveform. For a drum comprising a single drum sensor (preferably placed in the centre of the drum), a radial position of the drum hit can be determined using the drum head response waveform, which is obtained from the vibrations across the drum head, by processing the RF signal. The radial position may be determined by calibration and/or pattern matching of a detected waveform from the drum head sensor(s) when the drum is hit.

FIG. 5b shows the deformable separator element 64 between the passive tuned resonant circuit 11 and the active tuned resonant circuit 10. The deformable separator element 64, the passive tuned resonant circuit 11 and the active tuned resonant circuit 10 define a drum sensor stack with a mechanical path between the passive tuned resonant circuit 11 and the active tuned resonant circuit 10. FIG. 5b further shows the drum sensor stack further comprising the interposer element 65.

Figure 6A:
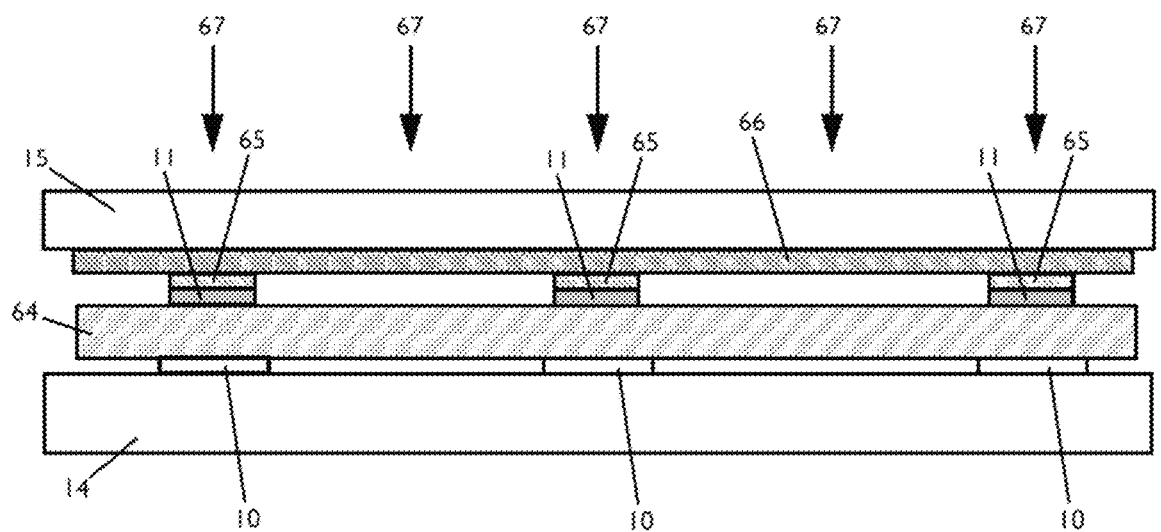
FIGS. 6a and 6b show an electronic drum comprising multiple drum sensors.
Figure 6B:
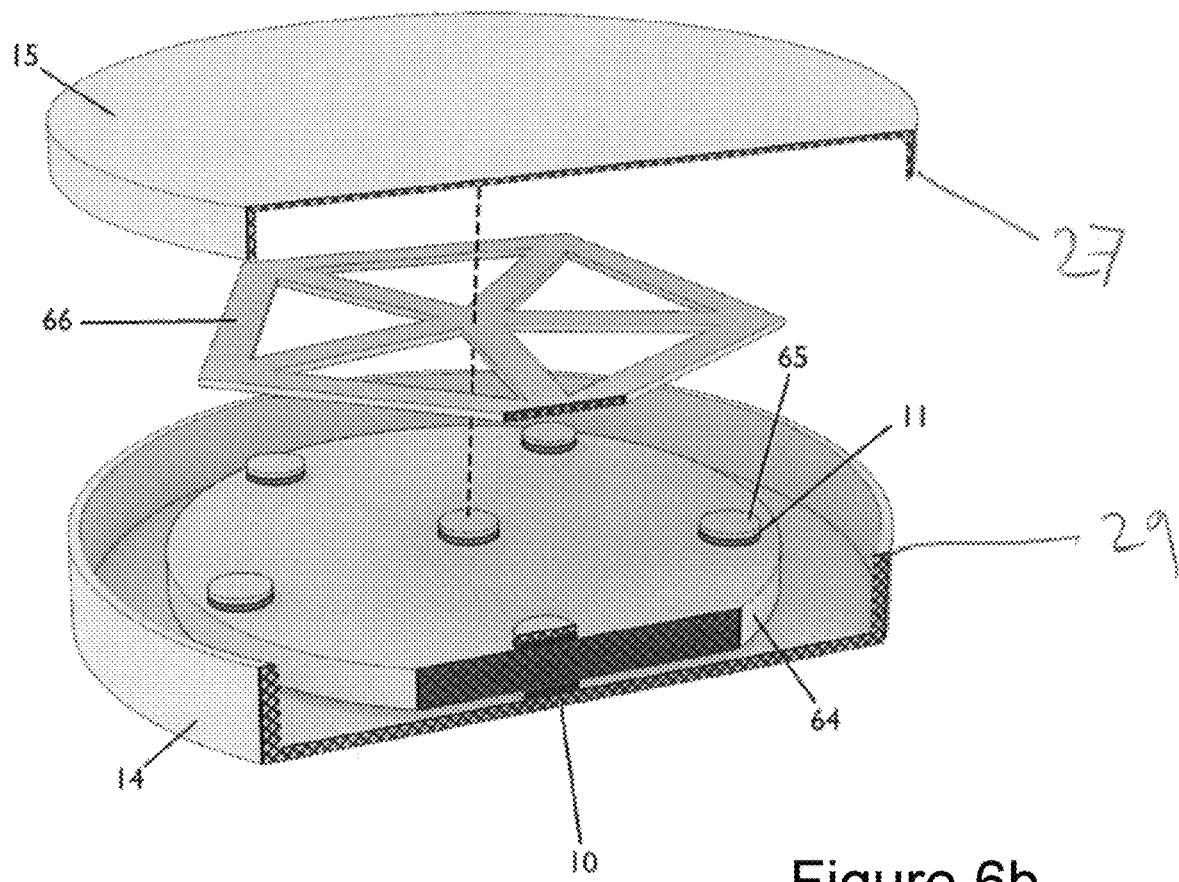

FIGS. 6a and 6b show an electronic drum comprising multiple drum sensors; optionally a perimeter of the drum head may be retained as shown in FIG. 5a (not shown in FIG. 6). The drum in FIGS. 6a and 6b comprises: a drum head 15; a deformable separator element 64; multiple drum sensors wherein each said position sensor comprises: a passive tuned resonant circuit 11; an interposer 65; and an active tuned resonant circuit 10. The multiple sensors can be used to determine a location at which the drum head has been hit e.g. by triangulation or interpolation based on an amplitude and/or timing of waveforms of the level of RF signal detected by the sensors.

The example drum of FIGS. 6a and 6b further comprises a rigid linking member 66 such that a point of movement 67 of said drum head causes corresponding movements of multiple passive tuned resonant circuits 11 of said drum sensors. This facilitates determination of the location of a hit of the drum pad (resulting in movement of said drum head) e.g. by calculation from the outputs of the drum sensors, for example by interpolation using a signal processor (not shown).

Generally, when using two or more drum sensors, the position of the hit can be determined from the instantaneous relative amplitudes of the signals from each drum sensor. It is then desirable for the drum sensor signals (amplitudes) to be measured closely enough in time relative to the duration of the transient being measured for signal decay not significantly to affect the measured amplitude. Optionally the timing between transients measured on multiple drum sensors may be used to obtain more information regarding the position of the hit, because it takes time for the movement of the drum head at the impact point of the hit to propagate across the drum head. This timing is dependent on the resonant frequency of the drum head. The measurement speed must be fast enough to detect the transient.

Thus where there are multiple drum sensors, the signal processor may be configured to determine a difference in amplitude between RF signals detected from multiple drum sensors to determine a position of a hit of the drum head. Additionally or alternatively, the signal processor may be configured to determine a difference in timings between RF signals detected from multiple drum sensors to determine a position of a hit of the drum head. The signal processor may be configured to process one or more of the amplitudes of the RF signal detected from the multiple drum sensors to determine, for example, how hard a hit is.

As shown in FIG. 6b, one of the multiple drum sensors may be positioned in the centre of the drum head; other drum sensors may be positioned adjacent to the edge the drum head.

As further shown in FIG. 6b an example drum may comprise a drum head lip 27 and a bottom member lip 29. The drum head lip 27 may be configured to fit inside the bottom member lip 29. Alternatively the bottom member lip 29 may be configured to fit inside the drum head lip 27.

Where there are multiple drum sensors, interposers of the drum sensors may be shared between one or more of the multiple drum sensors. The drum may further comprise a backplane bearing more than one of the active tuned resonant circuits of the multiple drum sensors. The backplane could be formed of PCB, and may be retained inside the drum. The signal processor may be incorporated into the backplane. Alternatively the signal processor may be outside the drum so that signals from multiple drums e.g. of a drum set, may be processed by a shared signal processor, for example, a single processing unit. For example, if groups of 8 sensors are multiplexed, there may be 8 sensors in each drum and the multiplexing and signal processing may be performed by an external controller comprising a signal processor.

On drums having multiple drum sensors, some of the active resonant circuits of the drum sensor may be active at the same time. This may be implemented for a drum having a drum head similar in diameter to a conventional acoustic drum, such as a snare drum. In embodiments a drum set (or "drum kit") comprises multiple drum heads.

Some drum sets/kits may comprise multiple drums heads that are smaller than conventional acoustic drums and may instead for example, be a few cm across and intended for hitting with fingers or small drumsticks. Each drum head/sensor may multiplexed such a winding of a coil of each drum sensor (of a set of sensors e.g. on the same drum head) is driven sequentially. Each drum may comprise more than one drum sensor.

In another implementation, which may be combined with those described previously, alternate sensors may be configured to be driven with different frequencies, e.g. operated at respective first and second resonant frequencies F1 and F2. Amongst a subset of sensors, in each time slot only one sensor operating at a first frequency of resonance may be enabled and only one sensor operating at a second frequency of resonance may be enabled. Furthermore, in implementations physically adjacent sensors are never enabled at the same time, minimising the interference components. A plurality of the subsets of sensors may be operated simultaneously.

Figure 7:
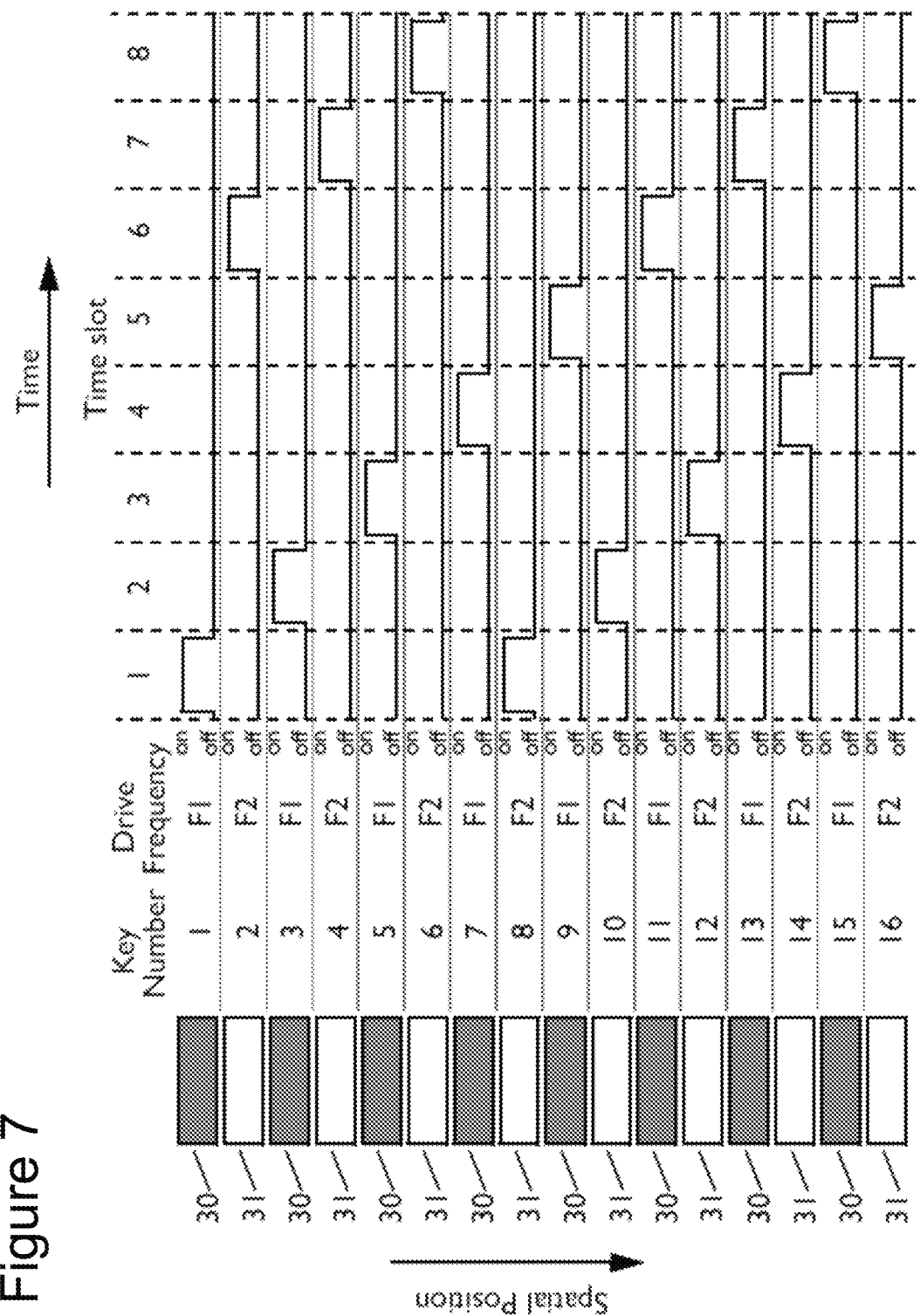
FIG. 7 shows a timing diagram of a time division multiplex circuit used to multiplex a plurality of active tuned resonant circuits.

An example multiplexing scheme is shown in FIG. 7. The sensors of the sensing system may be divided up into spatial groups e.g. each comprising sensors which are not directly adjacent to one another, illustrated by the black and white bars in FIG. 7. The sensors in one group may have a different resonant frequency to the sensors in another group. In an example, in a group, illustrated say by the black bars, there are 8 time slots and every $8^{th}$ sensor is activated (driven) simultaneously. This approach may be adapted for k time slots, driving every kth sensor simultaneously (that is simultaneously driven sensors have k−1 inactive sensors between them). Sensors in simultaneously active groups, e.g. illustrated by the black and white bars, may be (physically) separated as far as possible.

For example in implementations a multiplexing system is provided to multiplex the RF drive signal such that simultaneously driven sensors are separated or surrounded by at least (k−1) sensors, where (k−1) is an integer equal to or greater than 1, at least one detector detecting the level of RF signal from a driven sensor.

Some implementations of the system do not employ different groups of sensors with different resonant frequencies. Instead all the sensors may have substantially the same resonant frequency. Use of such an approach is facilitated by the coil design with opposite senses of winding described previously. Thus there may be k time slots and every kth sensor may be active (driven) simultaneously.

Figure 8:
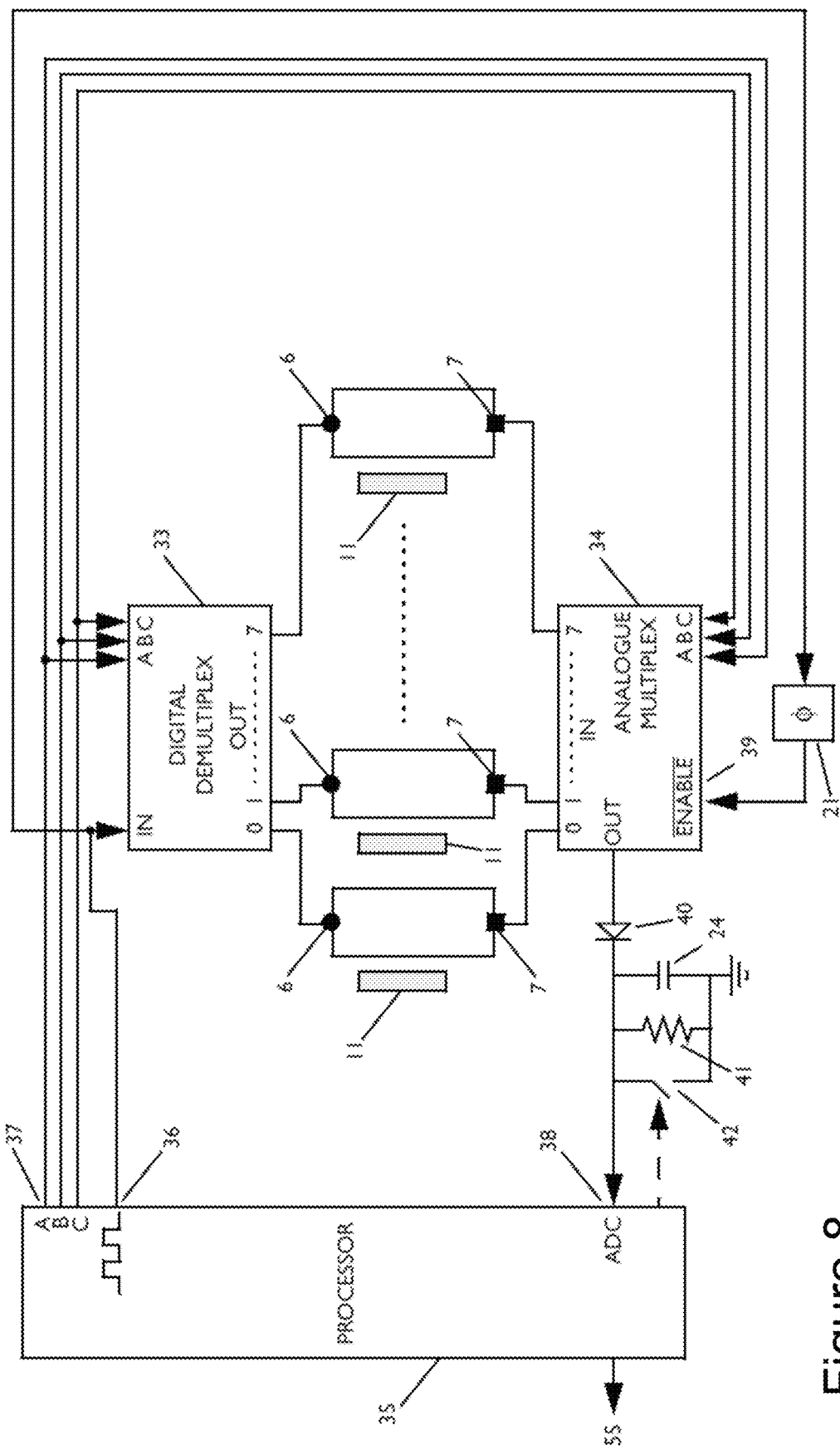
FIG. 8 shows a circuit diagram of a time division multiplex system to multiplex a plurality of active tuned resonant circuits to determine the position of a plurality of sensors.

FIG. 8 shows an example time-division multiplexed controller, configured to drive a set or subset of sensors operating at a single frequency of resonance. In the system of FIG. 8 a processor 35 generates a drive waveform 36 whose frequency matches the frequency of resonance the sensors' active tuned resonant circuits; the processor generates selector signals 37 to select which sensor is to be enabled; the sensors' outputs 7 are coupled to an analogue multiplexer 34; the analogue multiplexer's output is coupled to an analogue-to-digital converter within the processor via a low-pass filter comprising a capacitive element 24 and resistive element within the analogue multiplexer; and an output 55 from the processor used to send information regarding the position and velocity of the sensors. A further advantage to using the analogue multiplexer to couple the sensors' outputs to the analogue-to-digital converter is that the analogue multiplexer can perform the function of the analogue switch 22 used for synchronous demodulation whereby the output of the analogue multiplexer can be synchronously enabled and disabled via an enable input 39 coupled to the drive waveform 36. In the case where a plurality of sensors are operated at substantially different frequencies of resonance the time-division multiplexed scheme can be replicated as necessary. A suitable processor is an ARM Cortex-MO.

FIG. 8 shows just one demultiplexer/multiplexer but if there are multiple resonant frequencies one demultiplexer/multiplexer may be employed for each of the resonant frequencies used. For example a second demultiplexer/multiplexer may be used where alternate resonant frequencies are mapped to alternate sensors of the drum head/set.

Decreased sensitivity to detuning of the sensor's active tuned resonant circuit or passive tuned resonant circuit, for example, caused by variations of component tolerance, may be facilitated by coupling the output of the (optional) synchronous demodulator circuit to a peak detection circuit comprising a diode 40 a capacitive element 24 and optionally a resistive element 41 or a switching element 42 (to reset the charge on capacitive element 24). In the case where a switching element is used the switching element may reset the detected peak level synchronously with the selector signals used to control the multiplexers.

The signal from the detector (read-out circuitry) may be input to an analogue-to-digital converter 38, for example integrated into an analogue input of processor 35.

In the case where a disabled sensor's active tuned resonant circuit is not being driven, the active tuned resonant circuit acts as a tuned antenna. This can have a negative effect whereby moving the target corresponding to the disabled sensor can produce a measurable variation in the output of a similarly-tuned sensor. This is even if the similarly-tuned sensor is not physically adjacent to the disabled sensor and the motion of the target is constrained to be within its normal limits above the disabled sensor. This negative effect can be reduced by changing the frequency of resonance of the disabled sensor's active tuned resonant circuit for the duration of the disablement, for example by changing the capacitance, resistance or inductance of the active tuned resonant circuit by electronic switching. This can be done by driving the disabled sensor with a direct-current, or low-frequency signal, to prevent resonance. Referring to FIG. 8, a way to achieve this in a time-division multiplexed scheme is to use a digital demultiplexer 33 to drive the inputs 6 of the active tuned resonant circuits. Enabled sensors' active tuned resonant circuits are driven by a waveform 36 at the frequency of resonance of the active tuned resonant circuits and disabled sensors' active tuned resonant circuits are driven by a direct-current signal corresponding to logic-high or logic-low of the digital demultiplexer.

It is important for the performance of a drum head/set to be stable over a range of operating temperatures. Although the tuned resonant circuits used by a sensor as described herein have excellent temperature stability, particularly when the tuned resonant circuits are formed on a printed circuit board and the capacitive elements of the tuned resonant circuits comprise temperature-stable dielectrics (Class 1 dielectrics), other electronic elements in the circuit can have properties that change with temperature which may cause a variation in the output signal of the sensor with variations in operating temperature. Such electronic elements include but are not limited to: diode 40, digital demultiplexer 33, analogue multiplexer 34, resistive elements 4, 5 and 41, tracks on printed circuit boards, and voltage regulators. Therefore a temperature compensation scheme can be useful to minimise variations in the output signals of a plurality of sensors on a drum head/set caused by variations in operating temperature.

An example temperature compensation scheme comprises: performing measurements of the output signal of a sensor while driving the sensor's active tuned resonant circuit with a direct-current, or low-frequency signal such that the sensor's passive tuned resonant circuit has no effect on the output signal of the sensor; the first of the measurements is performed during a calibration procedure; the subsequent the measurements are performed periodically, typically within additional time slots of a time-division multiplexed scheme; calculating temperature-dependent offsets in the output signal by subtracting subsequent measurements from the first measurement; and adding the offsets to the measurement of the output signal when the active tuned resonant circuit is being driven at a frequency equal to or close to the frequency of resonance of the active tuned resonant circuit to measure position. Such a temperature compensation scheme may utilise one temperature-dependent offset for: each sensor; each group of sensors; or for all sensors.

A drum head/set utilising a multiplexing scheme as hereinabove described allows fast and accurate measurement of the position of the drum head. For example it is possible to multiplex the example shown in FIG. 8 wherein the frequency of update of selector signals 37 is at least 32,000 Hz thus allowing the position of each sensor in a subset of 8 sensors to be determined at a frequency of 4,000 Hz. This example can be replicated and run in parallel for other subsets of sensors, thus allowing many sensors to have their positions determined e.g. for 88 sensors at a rate of at least 352,000 sensors/second. Positions of the sensors should ideally be determined at least 250 times per second, corresponding to a rate of at least 22,000 sensing events per second for e.g. 88 sensors (e.g. 11 drum heads each with 8 sensors), to allow suitably accurate timing of hit events and optionally to determine the drum head velocity associated with the events. Implementations of the described system can easily exceed these targets.

Figure 9:
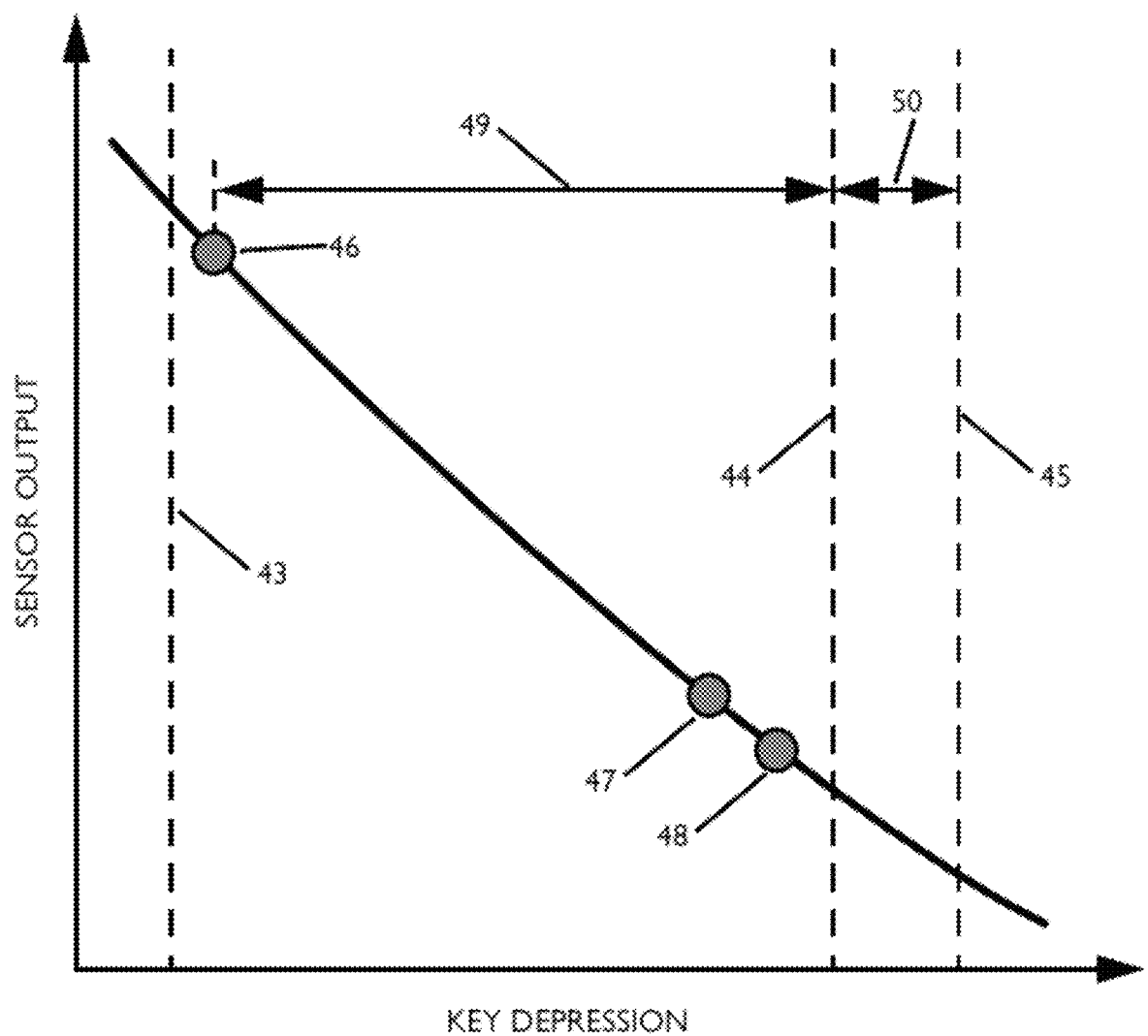
FIG. 9 shows a plot of the output of a sensor versus displacement.

FIG. 9, helpful for understanding operation of the sensor system, shows the sensor output from a sensor on a keyboard as it is depressed. There are three primary positions of the key: a resting position Kmax 43 when the key is at rest; a point Kzero 44 when a moveable top member of the key makes a first contact with a deformable end-stop; and a point of maximum depression Kmin 45, corresponding to the point of maximum pressure being applied to the drum head by a typical user at which the deformable end-stop may be considered to be maximally deformed. The signal determined when a drum head is hit are described later.

Figure 11:
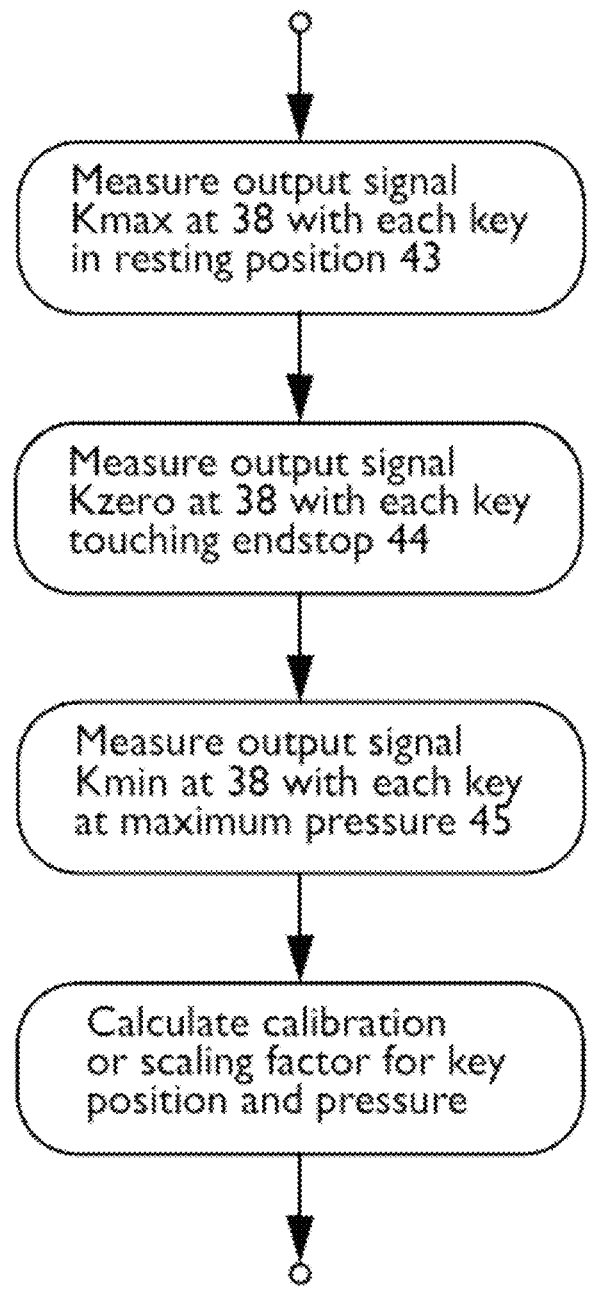
FIG. 11 shows an example calibration procedure for calibrating the detected position of a sensor.

For a plurality of such sensors, due to mechanical variation and due to electronic component tolerance, it is unlikely that the output signal of one sensor at any one of the primary positions will be identical to the output signal of a second sensor at the same primary position. Therefore a calibration procedure is desirable to ensure that the position of any sensor is known relative to the respective primary positions of the sensors. Such a calibration procedure is shown in FIG. 11.

In the case where the position of a sensor is between primary positions Kmax and Kzero, the calibrated position K of the sensor as a percentage of depression between Kmax and Kzero can thus be calculated from the measured position Ko of the sensor using the following equation: K=100%×(Ko−Kzero)/(Kmax−Kzero).

In the case where the position of a sensor is between primary positions Kzero and Kmin, the calibrated position Kpress of the sensor as a percentage of depression between Kzero and Kmin, 50 in FIG. 9, can thus be calculated from the measured position of the sensor 'Ko using the following equation: Kpress=100%×(Ko−Kmin)/(Kzero−Kmin). In such a case Kpress may be considered to be the amount of pressure being applied to the key, corresponding to the range of depression 50 of the sensor.

In some embodiments the calculation of Kpress may include an offset, Kpoff, whereby Kpress is zero until the position of the sensor Ko lies between (Kzero−Kpoff) and Kmin; thence Kpress=100%×(Ko−Kmin)/(Kzero−Kpoff−Kmin). The offset creates a dead-zone wherein variation in position of the sensor results in no variation of calibrated position K of the sensor and in no variation of Kpress. This facilitates implementation of an aftertouch threshold.

In some implementations each sensor may issue a drum-hit event when the depression of the drum head is beyond a secondary position Kon and may issue a release event when the depression of the sensor is returned to another secondary position Koff; other approaches are described later. In some cases Kon may equal Koff, but it is preferred for Kon and Koff to be unequal. Referring to FIG. 9, preferably secondary position Kon 48 is chosen to be near the primary position Kzero 44. Similarly, the secondary position Koff 47 is chosen to be near the secondary position Kon.

In some embodiments the secondary position Koff 46 of each sensor is chosen to be near the primary position Kmax 43. Such an arrangement allows the position of the sensor to be used to issue expression events prior to issuing a release event wherein the measured position Ko of the sensor between Koff and Kzero can be used to calculate a calibrated expression value Kexp=100%×(Ko−Kzero)/(Koff−Kzero), corresponding to the range of depression 49 of the sensor.

Figure 12:
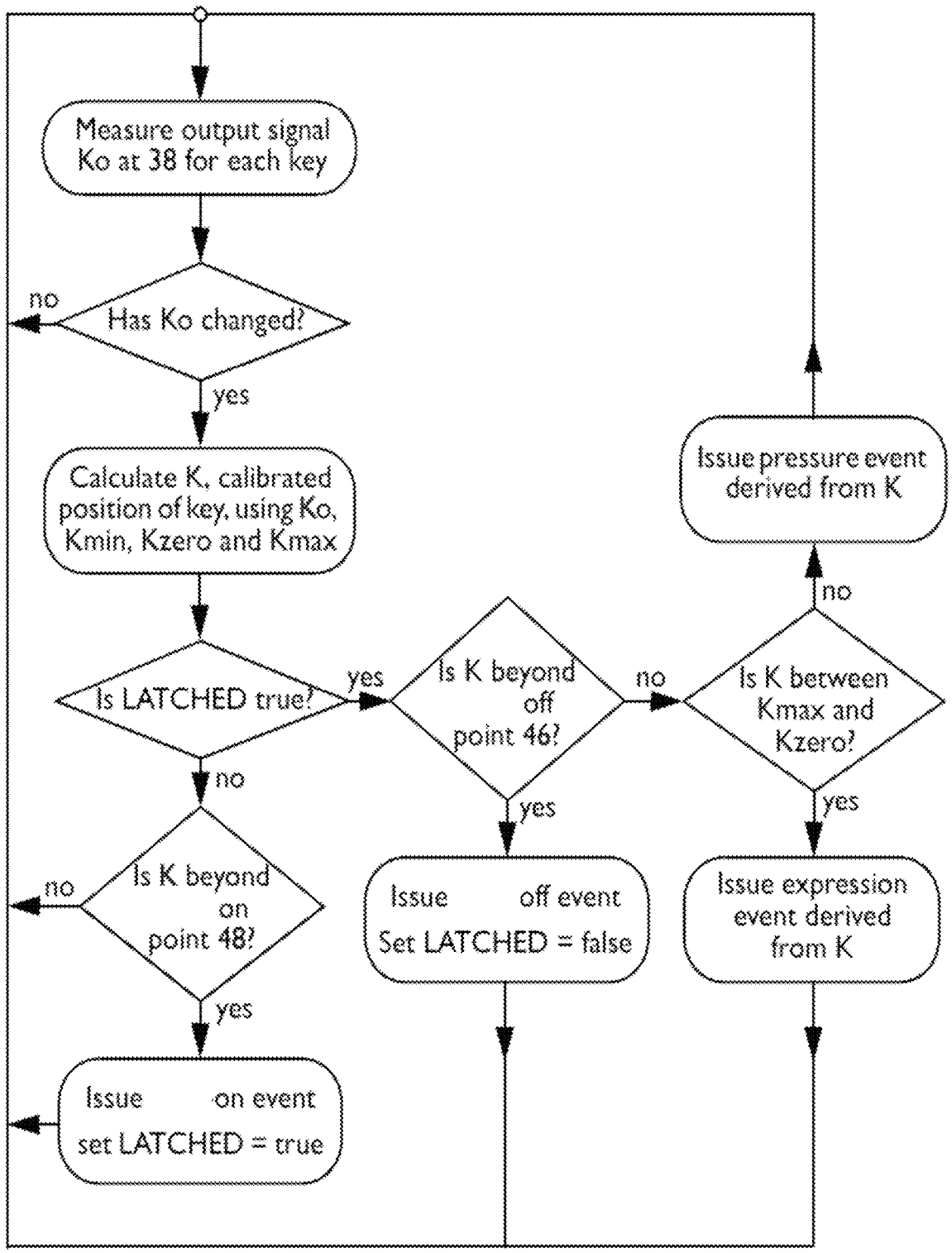
FIG. 12 shows an example process used to detect sensed events.

The example process of FIG. 12 may be used for each sensor in an implementation of the system wherein the measured position Ko of the sensor, when calibrated using primary positions Kmax, Kzero and Kmin and thence using secondary positions Kon and Koff, may be used to issue: hit events, release events, expression events and pressure events for each drum head/sensor.

A particular advantage of deriving the secondary positions Kon and Koff of a sensor on a drum head from the primary positions Kmax and Kzero is that the secondary positions can be modified easily by simple numerical calculations, allowing the response to be changed. Moreover such a modification can be different for each individual sensor/drum head in a drum set, allowing a large range of responses to be achieved without requiring any mechanical changes to drum head/set.

To provide further control it is possible to send velocity information relating to hit events and optionally also information related to release events. Such velocity information can be determined by measuring the separation in time between two known points of sensor depression, or conversely measuring the change in the depression at two known points in time.

In implementations the velocity (speed and direction) of a sensor is determined from a plurality of positions of the sensor at a plurality of corresponding times using averaging, filtering, or similar methods. An example is described in detail below. Such a method of calculating the velocity has several advantages over other methods: it does not assume a linear velocity profile as is used for a two-point measurement method but allows changes in velocity throughout the range of depression of the drum head/sensor to be detected thus measured values of velocity are more representative of the true velocity of the drum head/sensor thus making the response more consistent; higher resolution and precision of velocity can be determined because a larger number of statistically significant data points are used; and it allows predictions of the future position of the drum head/sensor to be calculated allowing, for example, the future time at which the drum head/sensor's position equals secondary positions Kon and Koff to be estimated, thus permitting hit or release events to be issued in advance of the corresponding physical event thus compensating for latency.

One example filtering procedure is as follows:

$$deltaV = deltaPos \text{ (i.e. the change in position between fixed time steps)}$$

$$alpha = k * abs(deltaV)$$

The filtering coefficient, alpha, depends on magnitude of deltaV; alpha is limited to sensible values to avoid overflow/underflow.

$$velocity = alpha * last\_velocity + deltaV * (1-alpha)$$

Such a method, which may be implemented in the digital domain, can provide improved resolution because of the filtering, which is especially important for a very slowly moving drum head, without significantly compromising the time response for a fast-moving drum head. Modifying the filtering and/or a maximum permitted velocity value can be used, for example, to give it a harder of softer response.

Figure 10:
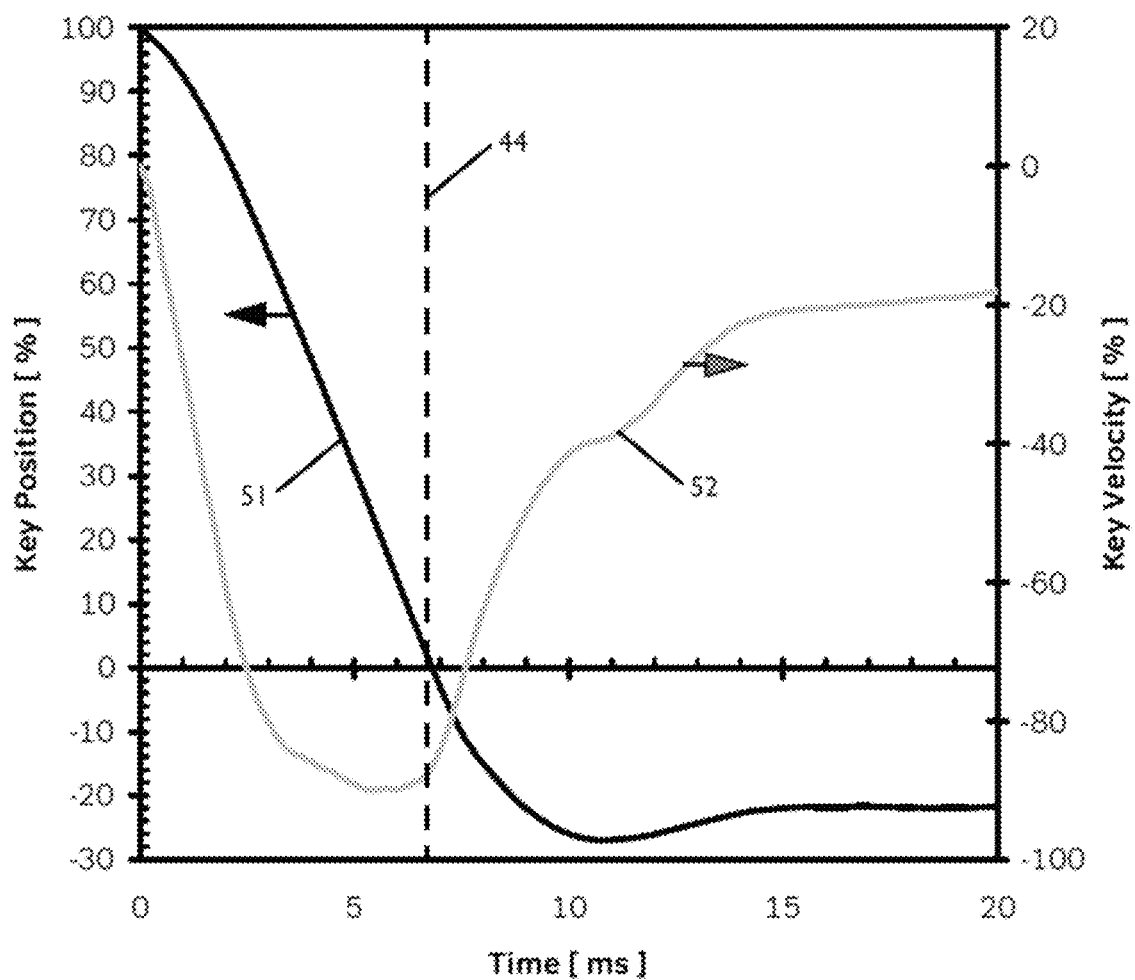
FIG. 10 shows an example of measured position and measured velocity of a sensor as it is depressed.

To illustrate such benefits of such a method, FIG. 10 shows the calibrated position 51 of a sensor and the corresponding calibrated velocity 52 of the sensor wherein the depression of the sensor reaches primary point Kzero 44 within 7 ms of the start of depression of the sensor. The plot of FIG. 10 approximates a velocity calculated directly from differentiated position but when the position moves slowly the velocity filtering is heavier so the velocity lags a little. Such a method can yield useful information regarding the velocity of a drum head/sensor.

Figure 13:
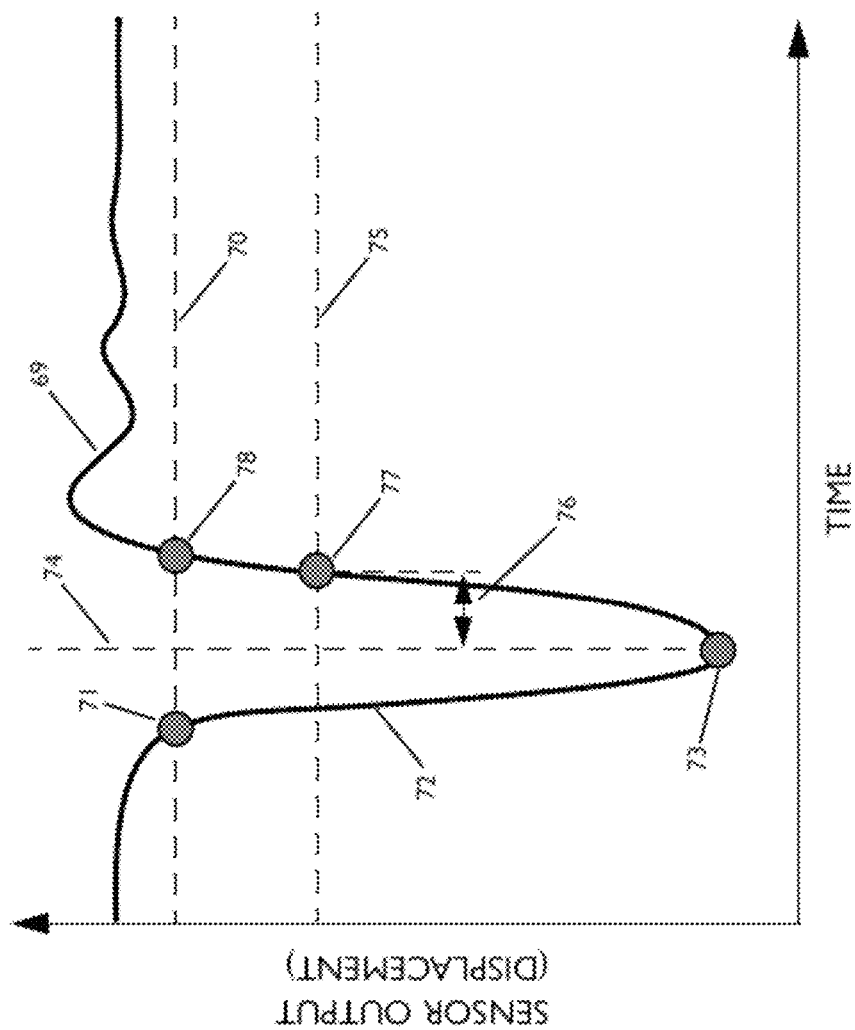
FIG. 13 shows an example of a transient response from a drum head sensor.
Figure 14:
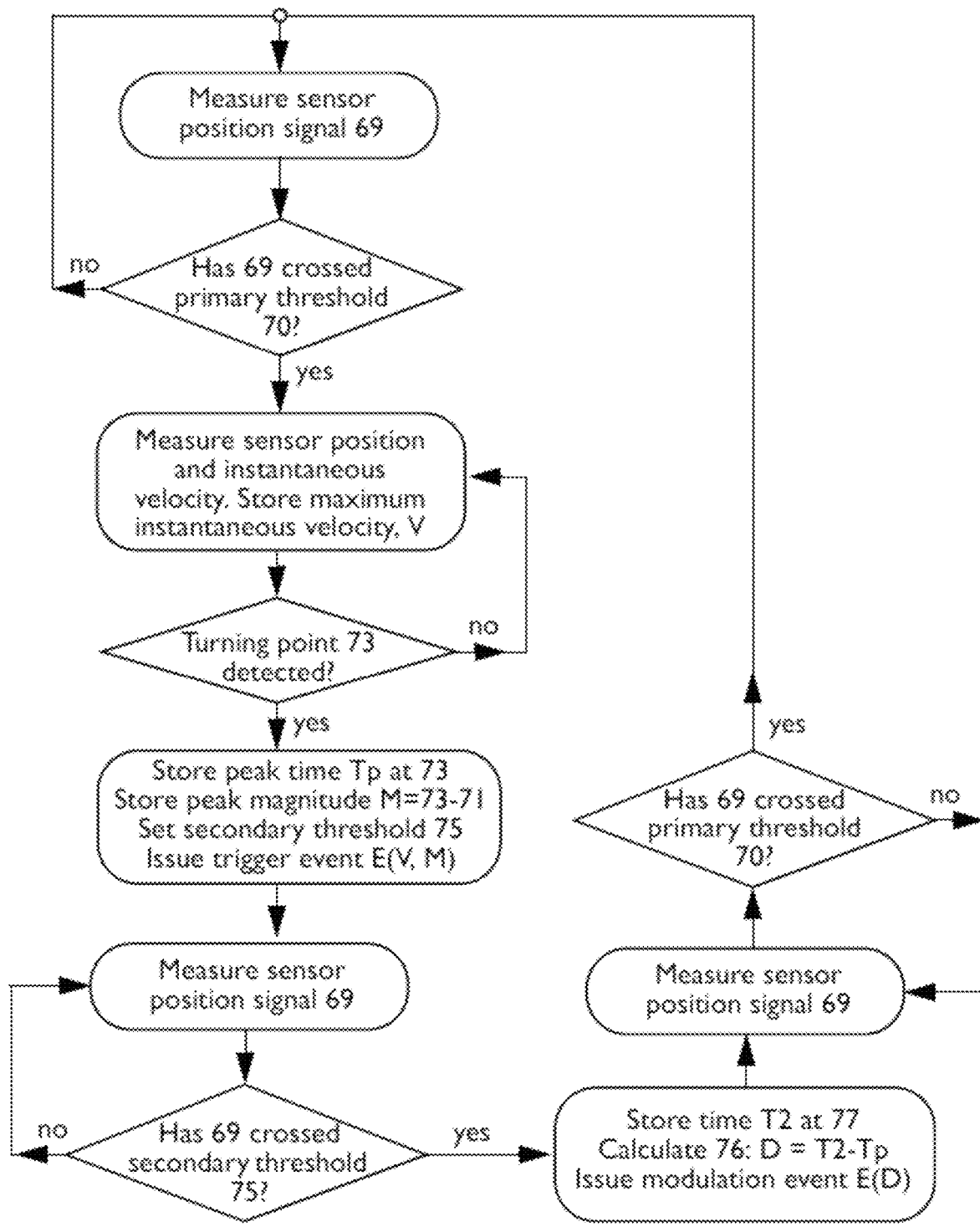
FIG. 14 shows an example of procedure used to generate a trigger event from the transient response of FIG. 13.

Referring to FIGS. 13 and 14, these shows an example of a transient response from a drum head sensor and a procedure used to generate a trigger event.

In an example signal processing technique the transient response is detected firstly by the position signal crossing a primary threshold 70. The primary threshold may be chosen to reject noise signals. The transient response may be detected secondly by the detection of a turning point 73. The strength of the strike on the drum may be sent as a parameter of the trigger event. The strength may be calculated from one or a combination of the following: a maximum velocity of the position sensor at 72 between the primary threshold and the turning point; and the maximum displacement of the position sensor calculated as the difference between the position at the turning point and the position at the primary threshold.

Optionally a modulation event may be generated to modify the response to the trigger event. A controlling parameter of the modulation event may be calculated by determining a secondary threshold 75 that lies between the primary threshold 70 and the turning point 73, and by measuring the time period 76 between the turning point and the point in time when the position crosses the secondary threshold 77.

In implementations, to avoid false triggering, further transient responses are not permitted until the position sensor output signal crosses the primary threshold 70. In some implementations, hysteresis may be applied such that the primary threshold used to detect a transient response is different to the primary threshold used to prevent false triggering.

To reject noise and low-frequency vibrations, it can be advantageous to high-pass filter the output of the position sensor. A typical high-pass filter may have a cut-off frequency of between 20-300 Hz.

Figure 15:
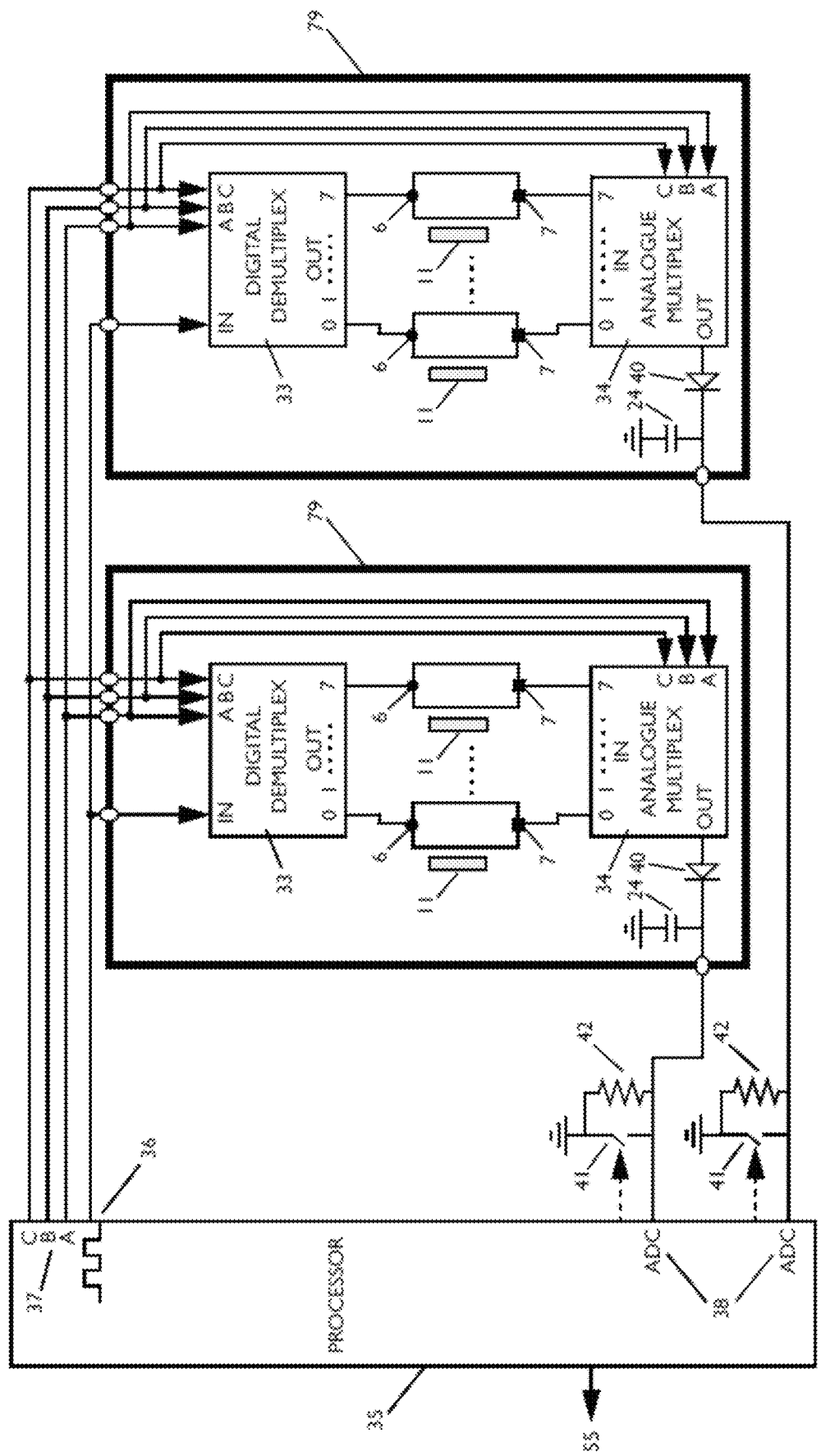
FIG. 15 shows an example of a time division multiplex system for a set of drum heads.

FIG. 15 shows an example time-division multiplexed controller, configured to drive multiple sensors for each of multiple drum heads (pads) or a drum set/kit. As illustrated each drum head (pad) 79 comprises multiple sensors which are multiplexed within the drum head (pad). As illustrated the system may be used to drive multiple drum heads each with a respective set of multiplexed sensors.

The described techniques can be advantageous because they can be fabricated inexpensively and because response times can be very quick, for example <1 ms.

Further aspects of the invention are set out in the following clauses:

1. A sensing system for an electronic drum pad. The sensing system may comprise a plurality of sensors. Each sensor may comprise a passive resonant circuit, for example for mounting on a moving part of a sensor, and an active resonant circuit, for example for mounting in a reference position. In implementations the passive resonant circuit has a resonant frequency and the active resonant circuit is configured to excite the passive resonant circuit at the resonant frequency. The sensing system may further comprise at least one sensor driver to drive the active resonant circuit with an RF drive signal at the resonant frequency; this may be shared between multiple sensors. In implementations the sensing system may further comprise a multiplexing system, such as one or more multiplexers and/or demultiplexers, to multiplex the drive signal such that simultaneously driven sensors are (physically) separated by at least (k–1) sensors, where (k–1) is an integer equal to or greater than 1. Thus in implementations one sensor is not driven at the same time as an adjacent sensor (or at the same time as a sensor at least k sensors away). The sensing system may further comprise at least one detector, for example readout-circuitry and/or a microprocessor, to detect a level of RF signal from a driven sensor. This may be used for sensing a position and/or velocity of a sensor associated with the electronic drum pad. The at least one detector may detect variation of a resonant RF signal in the active resonant circuit with relative position of the active and passive resonant circuits; it may peak-detect the level of RF signal.

2. A sensing system as defined in clause 1 configured to damp the active resonant circuits of sensors which are not driven.

3. A sensing system as defined in clause 1 or 2 wherein at least the active resonant circuit comprises one or more coils with windings in opposite senses, in particular wherein the windings in opposite senses are configured to generate magnetic fields in opposite senses to cancel one another.

4. A sensing system as defined in clause 1, 2 or 3 wherein the active resonant circuit comprises a pair of laterally adjacent pancake coils.

5. A sensing system as defined in any one of clauses 1 to 4 further comprising a temperature-compensation system to temperature-compensate the detected level of RF signal, wherein the temperature-compensation system is configured to apply an off-resonance drive signal to at least one of the active resonant circuits, to measure a level of the off-resonance drive signal from the at least one detector, and to compensate the detected level of RF signal responsive to the level of the off-resonance drive signal.

6. A sensing system as defined in clause 5 wherein the multiplexing system is configured to multiplex the drive signal such that one of the sensors is driven in each of a set of time slots, and wherein the temperature-compensation system is configured to apply the off-resonance drive signal during an additional time slot to the set of time slots.

7. A sensing system as defined in any one of clauses 1 to 6 wherein each sensor further comprises a deformable element to limit motion of one or both of the passive resonant circuit and the active resonant circuit for pressure sensing.

8. A set of sensors for an electronic drum pad. The drum pad has a plurality of sensors. The set of sensors may be part of a sensing system. Each sensor may comprise a passive resonant circuit for mounting on a moving part of a sensor and an active resonant circuit for mounting in a fixed, reference position, for example on part of the electronic drum. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the sensor. The variation may, in some implementations, be a variation in amplitude of signal in the resonant signal. The set of sensors may comprise sensors having two or more different resonant frequencies arranged such that sensors having the same resonant frequency are non-adjacent when mounted to sense sensors of the electronic drum pad.

9. A sensing system as defined in clause 8 wherein sensors having a first resonant frequency are interleaved with sensors having a second, different resonant frequency.

10. A sensing system as defined in clause 8 or 9 further comprising a multiplexing system and/or controller to control selection of sensors of the set of sensors such that adjacent sensors are selected at different times.

11. A sensing system as defined in any one of clauses 1-7 and 10 wherein the multiplexing system/controller is further configured to damp the active resonant circuits of unselected sensors.

12. A sensing system as defined in clause 10 or 11 wherein the multiplexing system/controller is configured to time division multiplex operation of the sensors, wherein each resonant frequency defines a group of sensors having the resonant frequency, wherein the time division multiplexing defines a plurality of n time slots, and wherein successive sensors of each group are allocated successive time slots.

13. A sensing system as defined in clause 12 wherein there are N resonant frequencies and N groups of sensors, wherein sensors of the groups of sensors are interleaved on the electronic drum pad.

14. A sensing system as defined in clause 13 wherein the multiplexing system/controller is configured such that sensors in the same group and activated in the same time slot have (n×N)–1 sensors between them.

15. A sensing system as defined in any preceding clause further comprising a processor configured to process the variation of the resonant signal in the active resonant circuit of each sensor to determine the motion of each sensor over a succession of time intervals as a depressed sensor moves between released and depressed positions, in particular wherein the motion of each sensor comprises a position and a velocity of the sensor as the sensor moves between released and depressed positions.

16. A sensing system as defined in clause 15 wherein the processor is configured to process the variation of the resonant signal in the active resonant circuit of each sensor to determine the velocity of a sensor, as the sensor moves between depressed and released positions, from changes in position of the sensor determined at successive time intervals filtered dependent upon sensor velocity.

17. A sensing system as defined in any preceding clause further comprising a processor coupled to process the level/variation of the RF/resonant signal to determine a sensor press and sensor release event for each sensor.

18. A sensing system as defined in any one of clauses 15-17 wherein the processor is further configured to distinguish between at least three different sensor positions, a first, off position, a second, on position, and a third, aftertouch position, wherein the aftertouch position is beyond the on position and corresponds to additional pressure applied to the sensor after depression.

19. A sensing system as defined in any preceding clause further comprising a substrate supporting the active resonant circuits for the sensors in a sequence corresponding to a sequence of sensors of the electronic drum pad.

20. An electronic drum pad comprising the sensing system of any preceding clause.

21. An aftertouch electronic drum pad comprising the sensing system or electronic drum pad of clause 19 or 20, each sensor having a deformable end-stop, such that the after-touch position corresponds to movement of a sensor beyond an end-stop position defined by the deformable end-stop, wherein identification of the aftertouch position for the sensor enables aftertouch.

22. A method of sensing the positions of a plurality of sensors of an electronic drum pad. The method may comprise providing each sensor with a passive resonant circuit for mounting, for example, on a moving part of a sensor and an active resonant circuit for mounting, for example, in a fixed, reference position, for example part of the computer drum. In some implementations the passive resonant circuit has a resonant frequency, the active resonant circuit exciting the passive resonant circuit at the resonant frequency. Each sensor may further have a detector, which may be shared, to detect variation of a resonant signal in the active resonant circuit with relative position of the active and passive resonant circuits to detect a position and/or velocity of the sensor. The method may further comprise arranging the sensors to operate at two or more different resonant frequencies arranged such that sensors having the same resonant frequency are non-adjacent. Additionally or alternatively and/or the method may further comprise reducing interference between sensors by configuring one or more coils of at least the active resonant circuits, and optionally also of the passive resonant circuits, to have windings in opposite senses.

23. A method as defined in clause 22 further comprising providing aftertouch by distinguishing between at least three different sensor positions, a first, off position, a second, on position, and a third, aftertouch position, wherein the aftertouch position is beyond the on position and corresponds to additional pressure applied to the sensor after depression and movement of a sensor beyond an end-stop position.

24. A method of periodically compensating a response of an electronic drum pad. Each sensor of the drum pad may comprise an active resonant circuit, a passive tuned resonant circuit and a detector. The method may comprise retrieving from storage a detected initial output signal of the sensor, $O_{r0}$, at a first time, $t_o$, wherein at to the active resonant circuit is being driven at a frequency below a resonant frequency of the active resonant circuit. The method may further comprise, periodically, for at least one of the sensors, detecting a later output signal of the sensor, $O_{r1}$, at a time after $t_0$. The method may then calculate an adjustment value, for example a difference between the initial output signal of the sensor and the later output signal of the sensor. The method may then further comprise compensating the response of the drum pad by adjusting an operational output of the sensor using the adjustment value. The operational output may be an output from the sensor when the active resonant circuit is being driven at the resonant frequency of the active resonant circuit. The method may further comprise operating the sensor according to a time division multiplexed addressing scheme. The method may then using a "spare" time slot of the time division multiplexed addressing scheme, in which the sensor is not operational, for the detecting.

25. The method of clause 24 further comprising operating the sensor according to a time division multiplexed addressing scheme, and using a time slot of the time division multiplexed addressing scheme in which the sensor is not operational for the detecting.

26. A set of sensors for an electronic drum pad. The drum pad has a plurality of sensors. The set of sensors may be part of a sensing system. Each sensor may comprise a passive resonant circuit for mounting on a moving part of a sensor and an active resonant circuit for mounting in a fixed, reference position, for example on part of the drum. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the sensor. The variation may, in some implementations, be a variation in amplitude of signal in the resonant signal. The set of sensors may comprise sensors having two or more different resonant frequencies arranged such that sensors having the same resonant frequency are non-adjacent when mounted to sense sensors of the drum pad.

The above described techniques may be employed to sense pressure in a sensor for an electronic drum pad, a sensor further comprising a deformable element, for example a block or layer of rubber, below and/or between of one or both of the passive resonant circuit and the active resonant circuit.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. An electronic drum, comprising:
   a bottom member;
   a drum head;
   a drum sensor comprising:
      a passive resonant circuit mounted on the drum head and having a resonant frequency; and
      an active resonant circuit mounted on the bottom member and configured to excite the passive resonant circuit at the resonant frequency;
   a sensor driver to drive the active resonant circuit with an RF drive signal at the resonant frequency;
   a detector to detect a level of RF signal from the driven active resonant circuit for sensing a position and/or velocity of the drum head; and
   a signal processor, coupled to the detector, configured to process the detected level of RF signal to sense a position and/or velocity of the drum head for determining when the drum head is hit.

2. The electronic drum of claim 1 wherein, the signal processor is configured to process the detected level of RF signal to determine a position on the drum head where the drum head is hit.

3. The electronic drum of claim 1 wherein, the signal processor is further configured to process the detected level of RF signal to determine one or both of how hard the drum head is hit and a time duration of contact with the drum head when the drum head is hit.

4. The electronic drum of claim 1, wherein the detected level of RF signal defines a drum head response waveform, and wherein the signal processor is configured to determine both a radial position of the hit on the drum head and a velocity of the drum head from the drum head response waveform of a single drum sensor.

5. The electronic drum of claim 1, wherein the detected level of RF signal from the drum sensor defines a drum head response waveform, wherein the electronic drum comprises two or more of the drum sensors, and wherein the signal processor is configured to determine one or both of a difference in amplitude and a difference in timing between the drum head response waveforms of the two or more sensors to determine a position of the hit on the drum head.

6. The electronic drum of claim 1, further comprising a drum sound generation system coupled to the signal processor, wherein the drum sound generation system is configured to select a digitized drum sound sample for audio output in response to an output from the signal processor.

7. The electronic drum of claim 1, wherein the drum sensor comprises a deformable separator element between the active resonant circuit and the passive resonant circuit, and wherein the passive resonant circuit, the deformable separator element and the active resonant circuit define a drum sensor stack with a mechanical path between the passive resonant circuit and the active resonant circuit.

8. The electronic drum of claim 1 wherein the drum sensor is configured to support the drum head.

9. The electronic drum of claim 1 wherein, the drum sensor stack further comprises an interposer element positioned between the drum head and the passive resonant circuit, to protect the passive resonant circuit.

10. The electronic drum of claim 9 comprising multiple user-interchangeable interposer elements, to enable a user to change adjusting the distance between the drum head and the passive resonant circuit.

11. The electronic drum of claim 9 comprising multiple drum sensors positioned at different locations on the drum head, and wherein the interposer element is shared between the multiple drum sensors.

12. The electronic drum of claim 1, comprising multiple drum sensors positioned at different locations on the drum head, wherein one of the multiple drum sensors is positioned at a centre of the drum head and at least one of the multiple drum sensors is positioned adjacent to an edge of the drum head.

13. The electronic drum of claim 12, wherein the sensing system further comprises a multiplexing system to multiplex the RF drive signals for the drum sensors such that simultaneously driven drum sensors positioned adjacent to an edge of the drum head are separated by at least one drum sensor in a radial direction.

14. The electronic drum of claim 1, wherein the drum head comprises a drum head lip around an edge of the drum head, and the bottom member comprises a bottom member lip around an edge of the bottom member, and wherein either: the lip the drum head is configured to fit inside the lip of the bottom member, or the lip the bottom member is configured to fit inside the lip of the drum head.

15. The electronic drum of claim 1, further comprising multiple drum sensors, and a temperature-compensation system to temperature-compensate the detected level of RF signal, wherein the temperature-compensation system is configured to apply an off-resonance drive signal to at least one of the active resonant circuits of the multiple drum sensors, to measure a level of the off-resonance drive signal from at least one detector of the multiple drum sensors, and to compensate the detected level of RF signal responsive to the level of the off-resonance drive signal.

16. The electronic drum or sensing system of claim 1 wherein, at least the active resonant circuit comprises a coil with windings in opposite senses, in particular wherein the windings in opposite senses are configured to generate magnetic fields in opposite senses to cancel one another.

17. The electronic drum or sensing system of claim 1 including a backplane, wherein the backplane bears a plurality of the active resonant circuits each comprising a respective coil with one or more windings, wherein at least some of the active resonant circuits are paired such that in a pair of the active resonant circuits a configuration of the one or more windings of a coil of one of the active resonant circuits is of opposite sense to a configuration of the one or more windings of a coil of the other of the active resonant circuit.

18. The electronic drum or sensing system of claim 17, further comprising the at least one sensor driver, wherein the active resonant circuits are arranged in spatial groups and wherein, for all the active resonant circuits in a spatial group, the one or more windings of the coils of the active resonant circuits have the same sense, wherein adjacent spatial groups the one or more windings of the coils of the active resonant circuits have opposite senses, and wherein within a spatial group the active resonant circuits are multiplexed such that are driven sequentially in time.

19. The electronic drum or sensing system of claim 1 comprising a plurality of drum heads each with multiple drum sensors, and comprising a multiplexing system to multiplex the RF drive signals for the drum sensors such that simultaneously driven drum sensors are in different drum heads and/or separated by at least one drum sensor in at least one of two orthogonal directions or in a radial direction.

20. A sensing system to sense pressure for an electronic drum pad, the sensing system comprising:
a plurality of drum pad sensors, wherein each sensor comprises:
a passive resonant circuit, and an active resonant circuit, the passive resonant circuit having a resonant frequency, the active resonant circuit being configured to excite the passive resonant circuit at the resonant frequency;
a drum sensor stack comprising a deformable element below and/or between one or both of the passive resonant circuit and the active resonant circuit;
the sensing system further comprising:
at least one sensor driver to drive the active resonant circuits with an RF drive signal at the resonant frequency; and
at least one detector to detect a level of RF signal from a driven sensor for sensing a position and/or velocity of the associated drum pad.

21. The electronic drum or sensing system of claim 20 wherein each of the passive resonant circuit and the active resonant circuit comprises a coil with first and second windings in opposite senses, and wherein the first and second windings are on opposite sides of a central axis of the drum sensor.

22. The electronic drum or sensing system of claim 20 further comprising:
- a backplane on the bottom member, wherein the backplane bears a plurality of the active resonant circuits each comprising a respective coil with one or more windings, each for a respective drum sensor; and
- the signal processor is configured to process the detected level of RF signal to sense a position and/or velocity of the drum head defining a drum head response associated with the drum sensor;
- wherein the signal processor is configurable to adjust the drum head response of one or more of the drum sensors, individually or in groups, to configure the sensitivity of the drum sensors to motion.

23. The electronic drum or sensing system of claim 22 further comprising non-volatile memory associated with the signal processor to store sensitivity configuration data defining the sensitivity of the drum sensors, individually or in groups, and an interface to enable one or more of: user definition of the sensitivity configuration data, import of the sensitivity configuration data, and export of the sensitivity configuration data.

* * * * *

UNITED STATES PATENT AND TRADEMARK OFFICE
CERTIFICATE OF CORRECTION

| | |
|---|---|
| PATENT NO. | : 11,449,152 B2 |
| APPLICATION NO. | : 17/266479 |
| DATED | : September 20, 2022 |
| INVENTOR(S) | : James Hastings Clark and John Michael McAuliffe |

It is certified that error appears in the above-identified patent and that said Letters Patent is hereby corrected as shown below:

On the Title Page

Item (30) "Foreign Application Priority Data" should read as follows:
Aug. 7, 2018 (GB).............................1812826.4
Jun. 26, 2019 (GB)............................1909213.9

In the Claims

In Claim 9, Column 27, Line 40, delete the word "stack".

Signed and Sealed this
Sixteenth Day of May, 2023

*Katherine Kelly Vidal*

Katherine Kelly Vidal
*Director of the United States Patent and Trademark Office*